United States Patent
Han et al.

(10) Patent No.: US 12,387,644 B2
(45) Date of Patent: *Aug. 12, 2025

(54) ELECTRONIC DEVICE AND USER INTERFACE DISPLAY METHOD

(71) Applicant: Samsung Electronics Co., Ltd., Gyeonggi-do (KR)

(72) Inventors: Junhee Han, Gyeonggi-do (KR); Pilwon Seo, Gyeonggi-do (KR); Jiwoo Lee, Gyeonggi-do (KR); Inho Shin, Gyeonggi-do (KR); Jiyoung Lim, Gyeonggi-do (KR)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

This patent is subject to a terminal disclaimer.

(21) Appl. No.: 18/657,944

(22) Filed: May 8, 2024

(65) Prior Publication Data

US 2024/0331601 A1 Oct. 3, 2024

Related U.S. Application Data

(63) Continuation of application No. 17/531,871, filed on Nov. 22, 2021, now Pat. No. 12,008,936, which is a
(Continued)

(30) Foreign Application Priority Data

Nov. 11, 2020 (KR) .................. 10-2020-0150360
Jan. 6, 2021 (KR) .................. 10-2021-0001528

(51) Int. Cl.
*G09G 3/00* (2006.01)
*H04B 5/72* (2024.01)
(Continued)

(52) U.S. Cl.
CPC ............... *G09G 3/035* (2020.08); *H04B 5/72* (2024.01); *H04W 64/00* (2013.01);
(Continued)

(58) Field of Classification Search
CPC .......... G09G 3/035; G09G 2340/0464; G09G 2354/00; G09G 2370/04; G09G 5/006;
(Continued)

(56) References Cited

U.S. PATENT DOCUMENTS

2006/0194619 A1 8/2006 Wilcox et al.
2010/0167791 A1* 7/2010 Lim ...................... G06F 1/1624
455/566
(Continued)

FOREIGN PATENT DOCUMENTS

CN 110597473 A 12/2019
CN 111432331 A 7/2020
(Continued)

OTHER PUBLICATIONS

International Search Report dated Feb. 18, 2022.
(Continued)

*Primary Examiner* — Xilin Guo
(74) *Attorney, Agent, or Firm* — Cha & Reiter, LLC

(57) ABSTRACT

An electronic device and method are disclosed. The electronic device includes a display an extended screen area that is exposed or stowed, according to a change in a state of the display of the electronic device, communication circuitry configured to transceive a signal to or using an angle-of-arrival (AOA) antenna disposed within the extended screen area, a memory, and a processor. The processor implements the method, including: determining a position of the electronic device relative to an external electronic device, using the communication circuitry, executing a sharing operation with the external electronic device, identifying whether the
(Continued)

display of the electronic device is disposed in a first state or a second state, based on detecting that the display is disposed in the first state, perform a first positioning operation for the external electronic device, and displaying a sharing interface according to the first positioning operation on the display.

20 Claims, 25 Drawing Sheets

Related U.S. Application Data continuation of application No. PCT/KR2021/015908, filed on Nov. 4, 2021.

(51) Int. Cl.
*H04W 64/00* (2009.01)
*H05K 5/02* (2006.01)

(52) U.S. Cl.
CPC ... *H05K 5/0217* (2013.01); *G09G 2340/0464* (2013.01); *G09G 2354/00* (2013.01); *G09G 2370/04* (2013.01)

(58) Field of Classification Search
CPC ... H04W 64/00; H05K 5/0017; H05K 5/0217; H01Q 1/243; H01Q 1/44; G06F 1/1698; G06F 1/1616; G01S 1/02; G01S 2013/0245; G01S 5/021; H04N 1/00342; H04N 23/69
See application file for complete search history.

(56) References Cited

U.S. PATENT DOCUMENTS

| | | |
|---|---|---|
| 2011/0037712 A1 | 2/2011 | Kim et al. |
| 2016/0219445 A1 | 7/2016 | Chou |
| 2016/0370450 A1 | 12/2016 | Thorn et al. |
| 2019/0064312 A1 | 2/2019 | Jeon et al. |
| 2019/0261519 A1 | 8/2019 | Park et al. |
| 2019/0384438 A1 | 12/2019 | Park et al. |
| 2020/0267246 A1 | 8/2020 | Song et al. |
| 2021/0056789 A1* | 2/2021 | Amuduri ................ G08B 13/22 |
| 2021/0155311 A1 | 5/2021 | Tanaka et al. |
| 2021/0219437 A1 | 7/2021 | Kim et al. |
| 2021/0314426 A1 | 10/2021 | Jung et al. |
| 2021/0333889 A1 | 10/2021 | Wang et al. |
| 2022/0014689 A1 | 1/2022 | Zahnert et al. |
| 2022/0070247 A1* | 3/2022 | Wang ...................... G06F 3/165 |
| 2022/0279062 A1* | 9/2022 | Ye ............................ G01S 5/04 |
| 2023/0143640 A1 | 5/2023 | Hua et al. |
| 2023/0188832 A1* | 6/2023 | Xu ...................... G06F 3/04817 |
| | | 348/333.01 |

FOREIGN PATENT DOCUMENTS

| | | |
|---|---|---|
| CN | 111610923 A | 9/2020 |
| JP | 5764779 B2 | 8/2015 |
| KR | 10-2012-0070140 A | 6/2012 |
| KR | 10-2017-0074563 A | 6/2017 |
| KR | 10-2019-0024087 A | 3/2019 |
| KR | 10-2019-0101184 A | 8/2019 |
| KR | 10-2020-0017704 A | 2/2020 |
| WO | 2019/245165 A1 | 12/2019 |

OTHER PUBLICATIONS

Written Opinion dated Feb. 18, 2022.
European Search Report dated Feb. 12, 2024.
Korean Office Action dated Apr. 8, 2025.

* cited by examiner

ELECTRONIC DEVICE AND USER INTERFACE DISPLAY METHOD

CROSS-REFERENCE TO RELATED APPLICATION(S)

This application is a continuation of U.S. patent application Ser. No. 17/531,871 filed on Nov. 22, 2021, which is a Continuation of International Application No. PCT/KR2021/015908, filed on Nov. 4, 2021, which claims priority to Korean Patent Application No. 10-2020-0150360, filed on Nov. 11, 2020 and Korean Patent Application No. 10-2021-0001528, filed on Jan. 6, 2021 in the Korean Intellectual Property Office, the disclosures of which are herein incorporated by reference.

TECHNICAL FIELD

Certain embodiments of the disclosure relate to an electronic device and a method for displaying a user interface of an electronic device.

BACKGROUND

With the development of digital technology, electronic devices have diversified into a variety of device types, including smartphones, laptops, tablets, etc. in addition to traditional personal computers. Modern electronic device design further tends towards portability and larger display screens, to enhance convenience for end users.

Electronic devices may be implemented with expandable display areas. For example, a part of a flexible display may extend outwards from within an inner space of an electronic device, thereby increasing screen area.

Meanwhile, an electronic device may include an "angle of arrival" or AOA-based antenna in order to identify a position relative to an external electronic device.

SUMMARY

An electronic device may include an AOA-based antenna disposed thereon, so as to interwork with a lower portion of a flexible display. If the screen area of the flexible display is expandable via sliding, the directivity of the AOA-based antenna may change disadvantageously.

Certain embodiments of the disclosure provide an electronic device and a method for displaying a user interface of an electronic device, such that when directivity of the AOA-based antenna changes according to the sliding operation, and a sharing operation is executing between the electronic device and an external electronic device, a user interface related to the sharing operation may be displayed.

An electronic device according to certain embodiments may include: a display including a first screen area that is maintained in exposure to an external environment, and an extended screen area that is exposed or stowed, according to a change in a state of the electronic device, communication circuitry configured to transceive a signal to or using an angle-of-arrival (AOA) antenna disposed within the extended screen area, a memory, a processor operatively coupled to the display, the AOA antenna, the communication circuitry, and the memory, wherein the memory stores instructions executable by the processor to cause the electronic device to: determine a position of the electronic device relative to an external electronic device, using the communication circuitry, execute a sharing operation with the external electronic device, identify whether the display of the electronic device is disposed in a first state or a second state, based on detecting that the display is disposed in the first state, perform a first positioning operation for the external electronic device, and display a sharing interface according to the first positioning operation on the display.

A method according to certain embodiments may include: executing a sharing operation to transceive data with an external electronic device using communication circuitry including an angle-of-arrival (AOA) antenna disposed, detecting whether a display of the electronic device is disposed in a first state or second state according to whether an extendable screen area of the display is stowed within the electronic device, or extended to be exposed to an external environment of the electronic device, executing, by a processor, a first positioning operation for the external electronic device based on detecting the display is in the first state, and displaying a sharing interface according to the first positioning operation on the display.

The electronic device and method (and variations thereof) disclosed herein are advantageous in that, when the directivity of an AOA-based antenna is changed by extension and/or retraction of a display via the sliding operation, a user interface related to sharing between the electronic device and an external electronic device may be displayed.

DETAILED DESCRIPTION

Figure 1:
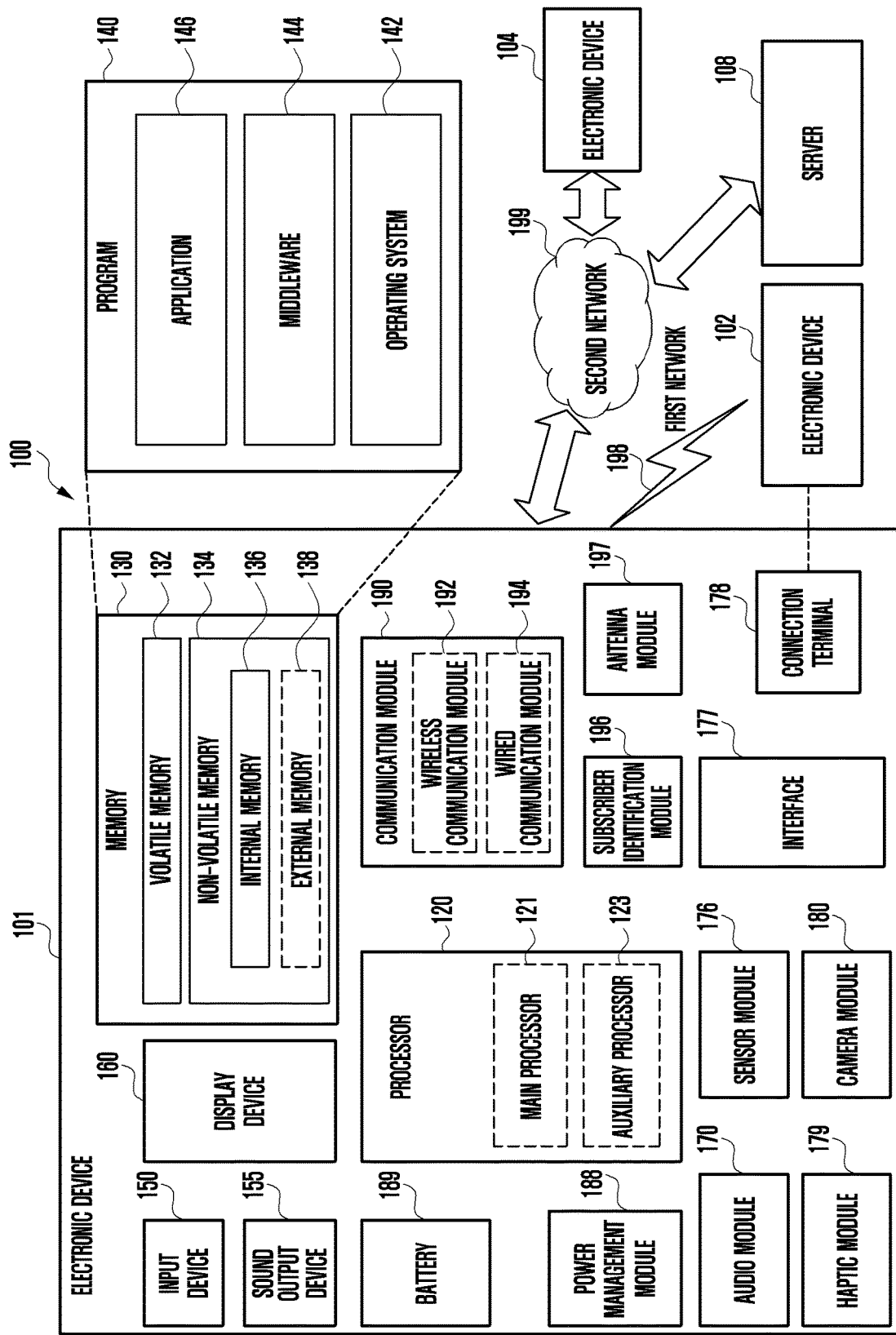
FIG. 1 is a block diagram illustrating an electronic device in a network environment.

FIG. 1 is a block diagram illustrating an electronic device 101 in a network environment 100 according to certain embodiments. Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to an embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted Boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thererto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element implemented using a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to certain embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

The electronic device according to certain embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that certain embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used in connection with certain embodiments of the disclosure, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Certain embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. The term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to certain embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to certain embodiments, each component (e.g., a module or a program) of the above-described components may include a single entity or multiple entities, and some of the multiple entities may be separately disposed in different components. According to certain embodiments, one or more of the above-described components may be omitted, or one or more other components may be added. Alternatively or additionally, a plurality of components (e.g., modules or programs) may be integrated into a single component. In such a case, according to certain embodiments, the integrated component may still perform one or more functions of each of the plurality of components in the same or similar manner as they are performed by a corresponding one of the plurality of components before the integration. According to certain embodiments, operations performed by the module, the program, or another component may be carried out sequentially, in parallel, repeatedly, or heuristically, or one or more of the operations may be executed in a different order or omitted, or one or more other operations may be added.

Figure 2:
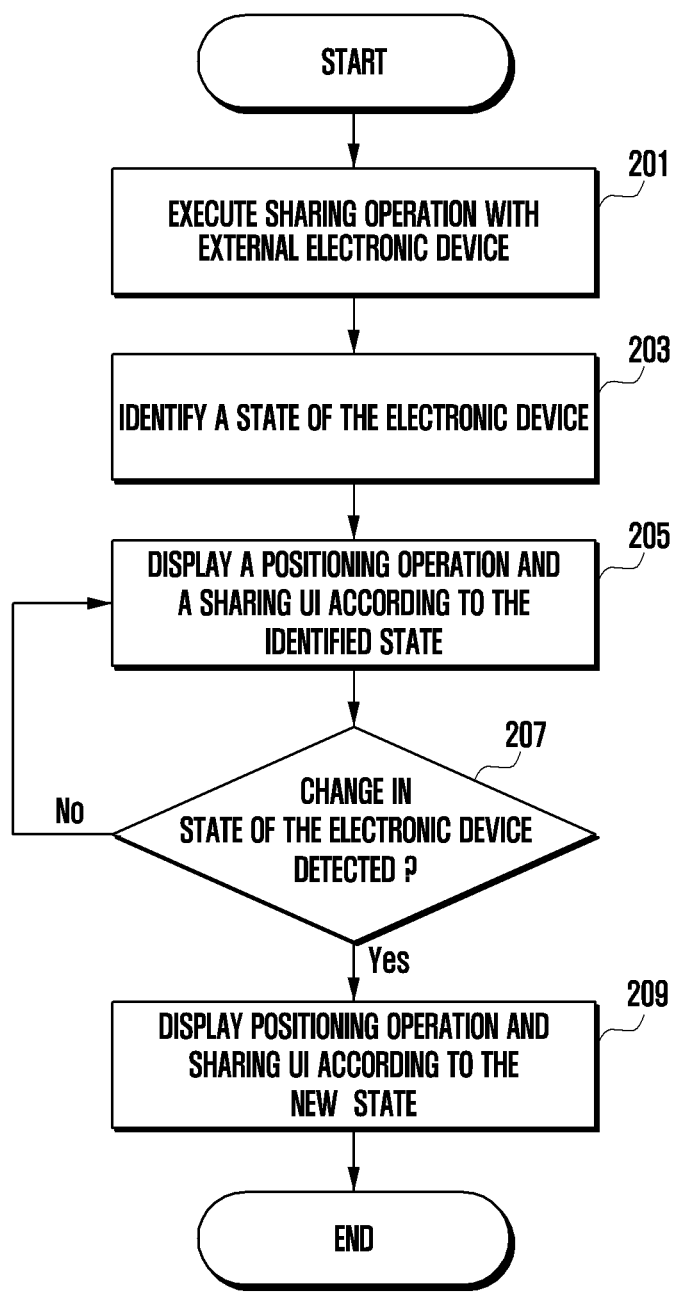
FIG. 2 is a flowchart illustrating an example method of displaying a user interface of an electronic device according to certain embodiments of the disclosure.

FIG. 2 is a flowchart illustrating a method of displaying a user interface of an electronic device 101 according to certain embodiments of the disclosure.

In operation 201, the electronic device 101 may perform a sharing operation with an external electronic device under the control of the processor 120. The electronic device 101 may activate an AOA (angle of arrival) antenna included in the electronic device 101 for sharing with the external electronic device. In certain embodiments, the electronic device 101 may discover and/or measure the location of the external electronic device using the AOA antenna included in the electronic device 101 to share data with the external electronic device. For example, the electronic device 101 may share an image, a screen, and/or a communication with an external electronic device. The electronic device 101 may execute and display a user interface related to a sharing operation in order to share an image, screen, and/or communication with the external electronic device.

The electronic device 101 may identify the state of the electronic device 101 in operation 203 under the control of the processor 120.

The electronic device 101 may extend or retract the display module 160 including the flexible display.

When the display module 160 including the flexible display performs a rolling operation to reduce the display module 160, the electronic device 101 may be in at least one of an open state, an extended state, and a rolling state.

The rolling operation of the display module 160 may include an operation in which the electronic device 101 retracts the display module 160 into the housing thereof for stowage.

When the display module 160 is extended by execution the sliding operation on the display module 160 including the flexible display, the electronic device 101 may be in at least one of a closed state, a reduced state, and a sliding state.

The sliding operation of the display module 160 may include an operation in which the electronic device 101 extends the display module 160 as to exit at least in part from an interior of the housing thereof, becoming visible and/or accessible to an external environment of the device.

In operation 205, the electronic device 101 may display a positioning operation and a sharing interface on the display module 160 according to the identified state under the control of the processor 120.

In certain embodiments, the electronic device 101 may perform a positioning operation using the AOA antenna according to the state of the electronic device 101.

In certain embodiments, the electronic device 101 may perform a ranging operation using the AOA antenna according to the state of the electronic device 101.

In certain embodiments, the electronic device 101 may perform an AOA measurement operation including distance measurement and direction measurement by using an AOA antenna according to the state of the electronic device 101.

For example, the electronic device 101 may measure the relative position and/or direction of the external electronic device spaced apart from the electronic device 101 by using the AOA antenna.

The directional position of the AOA antenna may be changed according to the state of the electronic device 101.

The AOA antenna may be a directional antenna using a patch antenna rather than an omni-directional antenna. The AOA antenna may be oriented in a direction perpendicular to the surface of the display module 160.

For example, when the electronic device 101 is in a closed state, the AOA antenna may face the rear surface of the electronic device 101. When the electronic device 101 is in the closed state, the electronic device 101 may measure the relative position and/or direction of the external electronic device in the rear direction of the electronic device 101. For example, when the electronic device 101 is in an open state, the AOA antenna may face the front surface of the electronic device 101. When the electronic device 101 is in the open state, the electronic device 101 may measure the relative position and/or direction of the external electronic device in the front direction of the electronic device 101.

In certain embodiments, the AOA antenna may face the lateral direction of the electronic device 101 according to movement (or rolling) of the display module 160. When the AOA antenna is disposed on the side surface of the electronic device 101, the electronic device 101 may measure the relative position and/or direction of the external electronic device in the lateral direction of the electronic device 101. In certain embodiments, the electronic device 101 may display a sharing interface on the display module 160 according to the state of the electronic device 101.

In certain embodiments, the AOA antenna may face the rear surface of the electronic device 101 when the electronic device 101 is in the closed state. When the electronic device 101 is in the closed state, the electronic device 101 may measure the relative position and/or direction of the external electronic device in the rear direction of the electronic device 101 and may display information on the relative position and/or direction of the external electronic device in the rear direction of the electronic device 101 on the display module 160 through a user interface.

In certain embodiments, the AOA antenna may face the front surface of the electronic device 101 when the electronic device 101 is in the open state. When the electronic device 101 is in the open state, the electronic device 101 may measure the relative position and/or direction of the external electronic device in the front direction of the electronic device 101 and may display information on the relative position and/or direction of the external electronic device in the front direction of the electronic device 101 on the display module 160 through the user interface.

In operation 207, the electronic device 101 may determine whether the state of the electronic device 101 is changed under the control of the processor 120.

When the state of the electronic device 101 is changed under the control of the processor 120, the electronic device 101 may proceed from operation 207 to operation 209.

When the state of the electronic device 101 remains under the control of the processor 120 without being changed, the electronic device 101 may proceed from operation 207 to operation 205.

In certain embodiments, the state of the electronic device 101 may be changed to a second state (e.g., open state) by a user's manipulation or automatically while the electronic device 101 is displaying the sharing interface on the display module 160 in a first state (e.g., closed state).

In operation 209, when the state of the electronic device 101 is changed, the electronic device 101 may display the positioning operation and the sharing interface on the display module 160 according to the changed state under the control of the processor 120.

In certain embodiments, when the electronic device 101 is changed from the open state to the closed state, the electronic device 101 may measure the relative position and/or direction of the external electronic device in the rear direction of the electronic device 101 and may display information on the relative position and/or direction of the external electronic device in the rear direction of the electronic device 101 on the display module 160 through the user interface. In this case, the electronic device 101 may display the positioning operation and the user interface on the display module 160 for a predetermined time before the state change.

For example, when the electronic device 101 is changed from the first state to the second state, a second user interface related to the second state may be displayed on the display module 160. In this case, the electronic device 101 may display, on the display module 160, the positioning operation and a first user interface in the first state together with the second user interface in the second state for a predetermined time.

When the electronic device 101 is changed from the second state to the first state, the first user interface related to the first state may be displayed, on the display module 160, the positioning operation and the second user interface in the second state together with the first user interface in the first state for a predetermined time.

For example, when the electronic device 101 is changed from the open state to the closed state, the user interface related to the closed state may be displayed on the display module 160. In this case, the electronic device 101 may display the positioning operation and the user interface in the open state on the display module 160 together with the user interface in the closed state for a predetermined time.

In certain embodiments, when the electronic device 101 is changed from the closed state to the open state, the electronic device 101 may measure the relative position and/or direction of the external electronic device in the front direction of the electronic device 101, and may display information on the relative position and/or direction of the external electronic device in the front direction of the electronic device 101 on the display module 160 through the user interface. For example, when the electronic device 101 is changed from the closed state to the open state, the electronic device 101 may display the user interface related to the open state on the display module 160. In this case, the electronic device 101 may display the positioning operation and the user interface in the closed state together with the user interface in the open state for a predetermined time on the display module 160.

Figure 3:
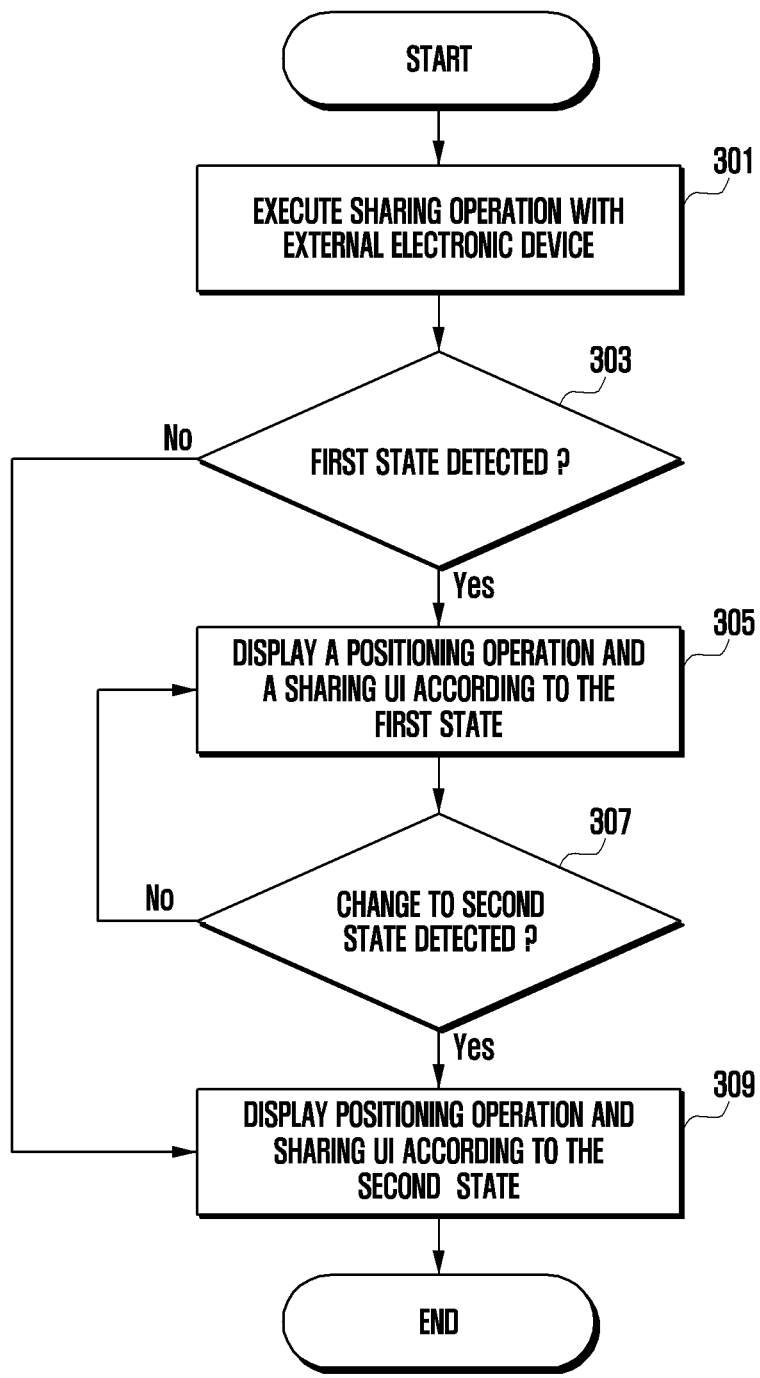
FIG. 3 is a flowchart illustrating an example method of displaying a user interface of an electronic device according to certain embodiments of the disclosure.

FIG. 3 is a flowchart illustrating a method of displaying the user interface of the electronic device 101 according to certain embodiments of the disclosure.

In operation 301, the electronic device 101 may perform a sharing operation with an external electronic device under the control of the processor 120. An AOA antenna included in the electronic device 101 may transmit/receive a positioning request message (e.g., a poll message or ranging message) and a positioning response message (e.g., a response message or ranging response message). The AOA antenna may include at least two or more patch antennas disposed on the display module 160. In certain embodiments, the AOA antenna may further include an antenna (e.g., frame antenna, FPCB antenna, or LDS antenna) included in the electronic device 101 as well as at least two or more patch antennas disposed on the display module 160.

Since the antenna (e.g., frame antenna, FPCB antenna, or LDS antenna) included in the electronic device 101 has a positioning effect of the patch antenna due to a direction of the display module 160, the antenna may be an omni-directional antenna for compensate for this.

In operation 303, the electronic device 101 may determine whether to be in a first state under the control of the processor 120. The first state of the electronic device 101 may be, for example, a closed state. The second state of the electronic device 101 may be, for example, an open state.

When the electronic device 101 is in the first state under the control of the processor 120, the electronic device 101 may proceed from operation 303 to operation 305.

When the electronic device 101 is in the second state under the control of the processor 120, the electronic device 101 may proceed from operation 303 to operation 309.

In operation 305, the electronic device 101 may display a first positioning operation corresponding to the first state of the electronic device 101 and a first sharing interface on the display module 160 under the control of the processor 120.

The AOA antenna may face the rear surface of the electronic device 101 when the electronic device 101 is in the first state. When the electronic device 101 is in the first state, the electronic device 101 may measure the relative position and/or direction of the external electronic device in the rear direction of the electronic device 101 through the first positioning operation. Information on the relative position and/or direction of the external electronic device in the rear direction of the electronic device 101 may be displayed on the display module 160 through the first sharing interface.

In operation 307, the electronic device 101 may determine whether the electronic device 101 is changed from the first state to the second state under the control of the processor 120.

When the state of the electronic device 101 is changed to the second state under the control of the processor 120, the electronic device 101 may proceed from operation 307 to operation 309.

When the state of the electronic device 101 remains under the control of the processor 120 without being changed, the electronic device 101 may proceed from operation 307 to operation 305.

In certain embodiments, the state of the electronic device 101 may be changed to the second state through a user's manipulation and/or automatically while the electronic device 101 is displaying the sharing interface on the display module 160 in the first state.

When the electronic device 101 is changed to the second state, in operation 309, the electronic device 101 may display a second positioning operation corresponding to the second state and a second sharing interface on the display module 160 under the control of the processor 120.

The AOA antenna may face the front surface of the electronic device 101 when the electronic device 101 is in the second state. When the electronic device 101 is in the second state, the electronic device 101 may measure the relative position and/or direction of the external electronic device in the front direction of the electronic device 101 through the second positioning operation. Information on the relative position and/or direction of the external electronic device in the front direction of the electronic device 101 may be displayed on the display module 160 through the second sharing interface.

In certain embodiments, when the electronic device 101 is changed from the first state to the second state, the electronic device 101 may display the relative position and/or direction of the external electronic device in the front direction of the electronic device 101, and may display information on the relative position and/or direction of the external electronic device in the front direction of the electronic device 101 on the display module 160 through the user interface. For example, when the electronic device 101 is changed from the first state to the second state, the electronic device 101 may display a second sharing interface on the display module 160. In this case, the electronic device 101 may display information on the relative position and/or direction of the external electronic device in the rear direction obtained by the positioning operation in the first state, on the second sharing interface for a predetermined time.

Figure 4:
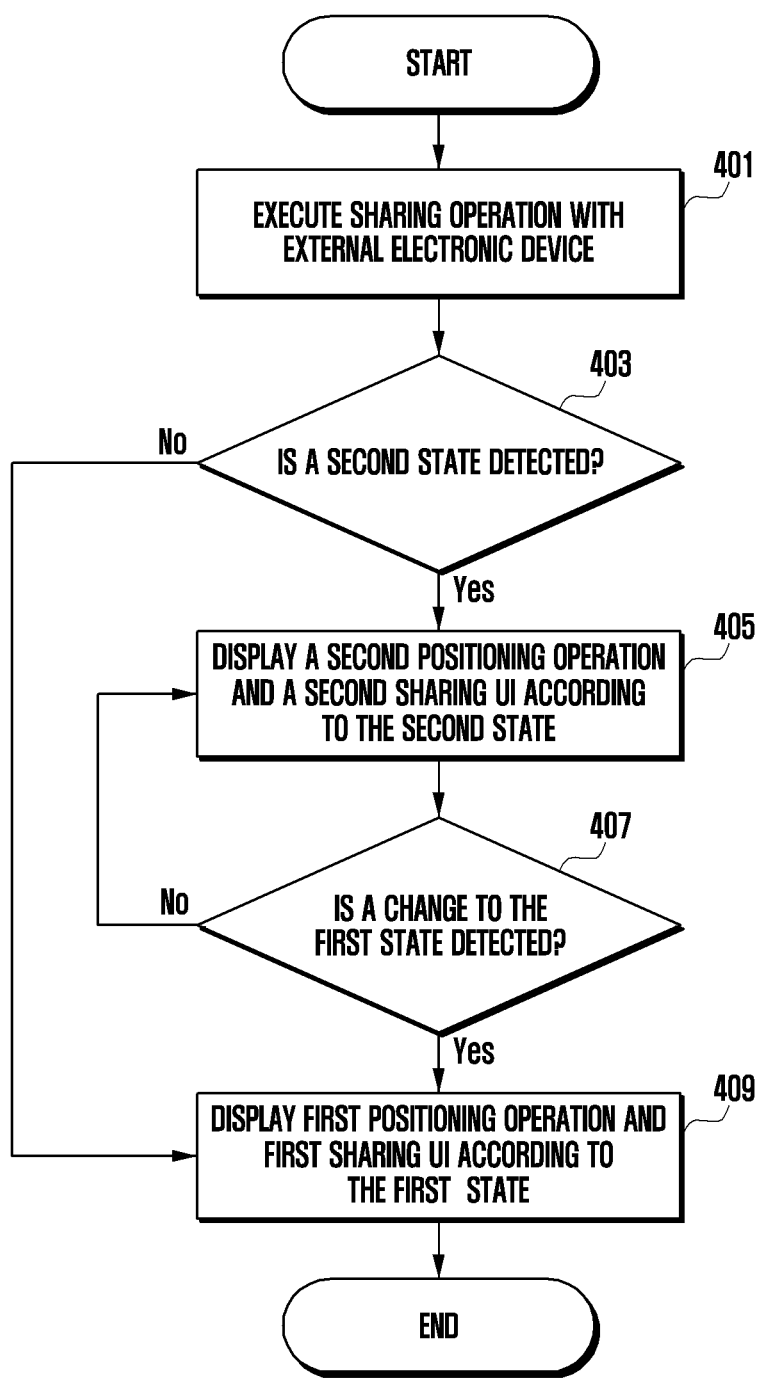
FIG. 4 is a flowchart illustrating an example method of displaying a user interface of an electronic device according to certain embodiments of the disclosure.

FIG. 4 is a flowchart illustrating a method of displaying the user interface of the electronic device 101 according to certain embodiments of the disclosure.

In operation 401, the electronic device 101 may perform a sharing operation with an external electronic device under the control of the processor 120.

In operation 403, the electronic device 101 may determine whether the electronic device 101 is in a second state under the control of the processor 120.

When the electronic device 101 is in the second state under the control of the processor 120, the electronic device 101 may proceed from operation 403 to operation 405.

When the electronic device 101 is in a first state under the control of the processor 120, the electronic device 101 may proceed from operation 403 to operation 409.

In operation 405, the electronic device 101 may display a second positioning operation corresponding to the second state of the electronic device 101 and a second sharing interface on the display module 160 under the control of the processor 120.

In operation 407, the electronic device 101 may determine whether the electronic device 101 is changed from the second state to the first state under the control of the processor 120.

When the state of the electronic device 101 is changed to the first state under the control of the processor 120, the electronic device 101 may proceed from operation 407 to operation 409.

When the state of the electronic device 101 remains under the control of the processor 120 without being changed, the electronic device 101 may proceed from operation 407 to operation 405.

In certain embodiments, the state of the electronic device 101 may be changed to the first state by a user's manipulation or automatically while the electronic device 101 is displaying the sharing interface on the display module 160 in the second state.

When the electronic device 101 is changed to the first state, in operation 409, the electronic device 101 may display a first positioning operation corresponding to the first state and a first sharing interface on the display module 160 under the control of the processor 120.

An AOA antenna may face the rear surface of the electronic device 101 when the electronic device 101 is in the first state. When the electronic device 101 is in the second state, the electronic device 101 may measure the relative position and/or direction of the external electronic device in the front direction of the electronic device 101 through a second positioning operation. Information on the relative position and/or direction of the external electronic device in the front direction of the electronic device 101 may be displayed on the display module 160 through the second sharing interface.

In certain embodiments, when the electronic device 101 is changed from the second state to the first state, the electronic device 101 may display the relative position and/or direction of the external electronic device in the rear direction of the electronic device 101, and may display information on the relative position and/or direction of the external electronic device in the rear direction of the electronic device 101 on the display module 160 through the user interface. For example, when the electronic device 101 changes from the second state to the first state, the electronic device 101 may display the first sharing interface on the display module 160. In this case, the electronic device 101 may display the information on the relative position and/or direction of the external electronic device in the front direction obtained through the positioning operation in the second state on the first sharing interface for a predetermined time.

Figure 5A:
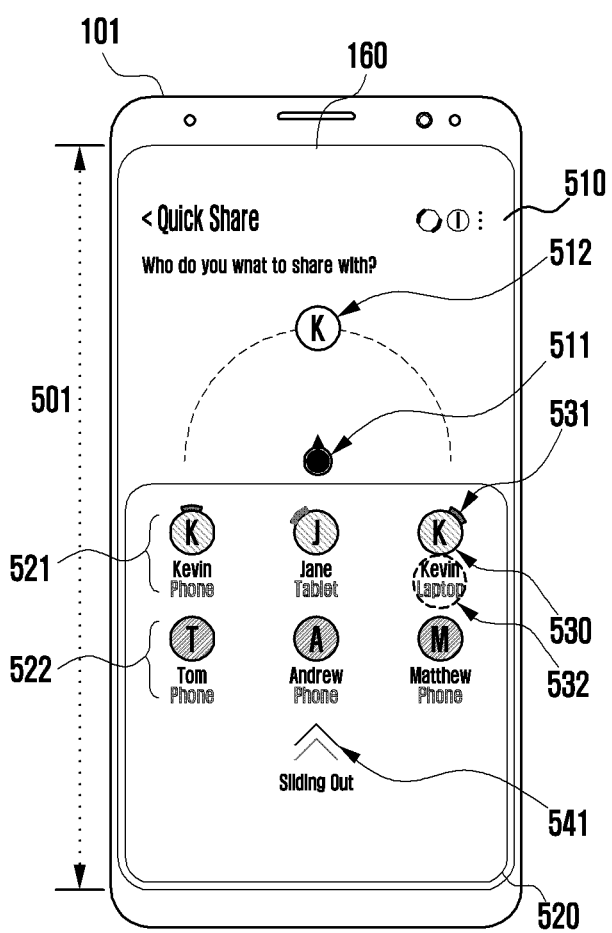
FIG. 5A is a diagram illustrating an example user interface of an electronic device in a first state according to certain embodiments of the disclosure.

FIG. 5A is a diagram illustrating the user interface of the electronic device 101 in a first state according to certain embodiments of the disclosure.

Figure 5B:
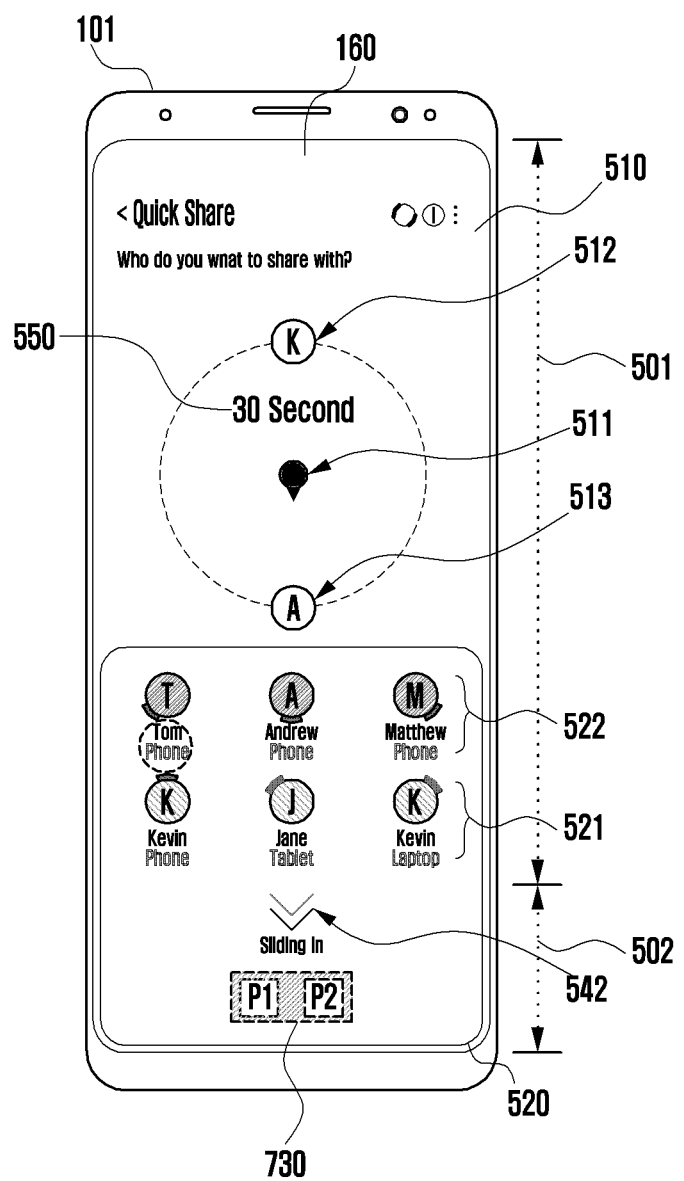
FIG. 5B is a diagram illustrating an example user interface of an electronic device in a second state according to certain embodiments of the disclosure.

FIG. 5B is a diagram illustrating the user interface of the electronic device 101 in a second state according to certain embodiments of the disclosure.

In FIG. 5A, the electronic device 101 is disposed in a first state (or a closed state). The electronic device 101 is slidable and can extend the display module 160 is in the first state. Initially here, the electronic device 101 may display a user interface through the display module 160 having a basic screen 501 (e.g., a first or initial screen area). The basic screen 501 may be expandable by sliding, and may include a minimum screen of the electronic device 101 prior to extending the display module 160.

In FIG. 5B, the electronic device 101 is disposed in a second state (or an open state). When the electronic device 101 slides relative to itself, as to extend the display module 160 into the second state, the electronic device 101 may then display the user interface through the display module 160 on both the basic screen area 501 and an extended screen area 502.

In FIG. 5B, when the electronic device 101 enters the second state (or the open state), an AOA antenna 730 disposed below the display module 160 may be directed from the rear direction of the electronic device 101 to the front direction thereof.

The user interface may include an interface 510 (e.g., a first display region) that is related to the direction of the AOA antenna, and/or an interface 520 (e.g., a second display region) related to an external electronic device with which information sharing is to be executed.

The interface 510 for the AOA antenna direction may include an AOA antenna indicator 511 and an interface 512 for a first corresponding device (e.g., icons 511, 512). The AOA antenna indicator 511 may indicate a direction in which the AOA antenna is directed with respect to the electronic device 101. The interface 512 for the first corresponding device may include an interface (or an icon) indicating the electronic device 101, and/or the electronic device 101 within a predetermined distance with respect to the AOA antenna, and/or a device correspond to (matching) the AOA.

In FIGS. 5A and 5B, an external electronic device "K" (the first corresponding device) may be located within a minimum directivity angle (about +/−5 degrees) with respect to the AOA antenna of the electronic device 101, and may thus be positioned on a directional line directed by the electronic device 101. The AOA antennas may function with detection reliability for +/−60 degree measurements. In FIG. 5A, the electronic device 101 may select the external electronic device "K" for recommendation corresponding to a "frontal" direction of the AOA antenna and/or the direction directed by the electronic device 101, and may display the recommended external electronic device "K" using the interface 512 representative of the first corresponding device, thereby facilitating convenient selection the first corresponding device for sharing data.

In FIG. 5A, the external electronic device "K" is selected for recommendation because the external electronic device "K", which is the first corresponding device, is disposed within the minimum directional angle of the AOA antenna. However, if the directional angle of the electronic device 101 is rotated to left/right, a tablet "J" and a laptop "K" may be recommended instead as they transition into the minimum directional angle of the AOA antenna.

The electronic device 101 may display slide control icons 541 and 542 (e.g., "sliding controllers"), which may be related to sliding-in and/or sliding-out on the display module 160. The sliding controllers 541 and 542 may indicate a slid-in and/or slid-out state of the display module 160 of the electronic device 101. In certain embodiments, the sliding controllers 541 and 542 may be selectable by a user input, and in response to selection, may trigger actuation of the slide-in and/or slide-out state of the display module 160 for the electronic device 101.

In FIG. 5A, the electronic device 101 may display the interface 510 related to the AOA antenna direction, and the interface 512 related to the first corresponding device on the display module 160. In this case, when the electronic device 101 is switched to the second state (whether manually by the user, or automatically by mechanism), an interface 513 related to a second corresponding device may be displayed as shown in FIG. 5B. In certain embodiments, in FIG. 5B, the electronic device 101 may simultaneously display the interface 512 related to the first corresponding device, and the interface 513 related to the second corresponding device on the display module 160 for a predetermined time.

In certain embodiments, the electronic device 101 may display a timer 550 related to a predetermined time on the interface 510 related to the AOA antenna direction.

The interface 520 for a shareable external electronic device may include an interface 521 (e.g., a selectable icon) for a shareable external electronic device in a first state and an interface 522 (e.g., another selectable icon) for a shareable external electronic device in a second state. The interface 520 related to the shareable external electronic device may prioritize the interface 521 related to the shareable external electronic device in the first state and the interface 522 related to the shareable external electronic device in the second state based on the state of the electronic device 101, and may display the prioritized interfaces 521 and 522 on the display module 160.

For example, as in FIG. 5A, when the electronic device 101 is in the first state, the interface 520 related to the sharable external electronic device may arrange the interface 521 related to the sharable external electronic device in the first state in the first row and may arrange the interface 522 related to the sharable external electronic device in the second state in the second row.

For example, as in FIG. 5B, when the electronic device 101 is in the second state, the interface 520 related to external electronic devices with which sharing may be executed, may disposed the interface 522 (e.g., the icon) related to the sharable external electronic device "M" in the second state in the first row and may arrange the interface 521 related to the sharable external electronic device in the first state in the second row "K"".

In FIG. 5B, when the display module 160 of the electronic device 101 is extended and is in the second state, the interface 510 related to the AOA antenna direction may be extended, and the interface 513 related to the second corresponding device may be displayed while the size and position of the interface 520 related to the shareable external electronic device are maintained. In FIG. 5A, at least one or more sharing device icons 530 included in the interface 520 related to the shareable external electronic device may further include a directional indicator 531 and text 532. The sharing device icon 530 may display a character or image (e.g., an image configured by the user) representing a user's name of a shareable device on the icon. In addition, the sharing device icon 530 may at least partially include the direction indicator 531 indicating a relative direction (or azimuth) from the electronic device 101. The text 532 may further display information indicating the user's name of the shareable device and/or the type of the device (e.g., laptop, tablet, or mobile phone).

In FIG. 5A, when the electronic device 101 is in the first state for a predetermined time or longer, the electronic device 101 may cause the interface 522 related to the sharable external electronic device in the second state to be removed from display on the display module 160, and may maintain display of the interface 521 related to the sharable external electronic device in the first state to be displayed on the display module 160.

Figure 6:
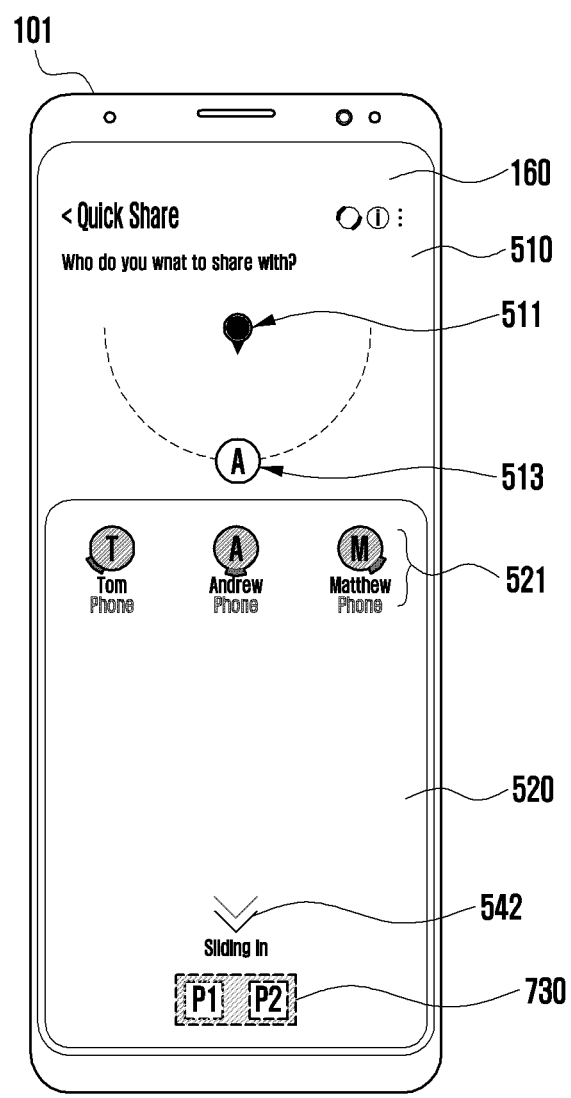
FIG. 6 is a diagram illustrating an example user interface when a predetermined time has elapsed in FIG. 5B.

FIG. 6 is a diagram illustrating a user interface when a predetermined time has elapsed in FIG. 5B.

The electronic device 101 may display the user interface as shown in FIG. 5B on the display module 160 after the device is switched from the first state to the second state. At this time, when a predetermined time (e.g., 30 seconds) has elapsed, an AOA antenna 730 may track the location of the external electronic device 513 in the second state, as this tracking directionality is more readily function in the second state than in the first state. When a predetermined time has elapsed after being switched to the second state, the electronic device 10 may terminate display of the interface 512 related to the first corresponding device, and may maintain display of the interface 510 related to the AOA antenna directionality, and the interface 513 related to a second corresponding device on the display module 160.

In certain embodiments, while continuously tracking the location of the device measured in the first state using an omni-directional antenna (e.g., frame antenna) disposed in a side frame of the electronic device 101, the electronic device 101 may track the location of the external electronic device in the second state. In this case, even if a predetermined time (e.g., 30 seconds) has elapsed after the electronic device 101 is switched from the first state to the second state, as shown in FIG. 5B, the interface 512 for the first corresponding device and the interface 513 for the second corresponding device may be simultaneously displayed on the display module 160.

Figure 7A:
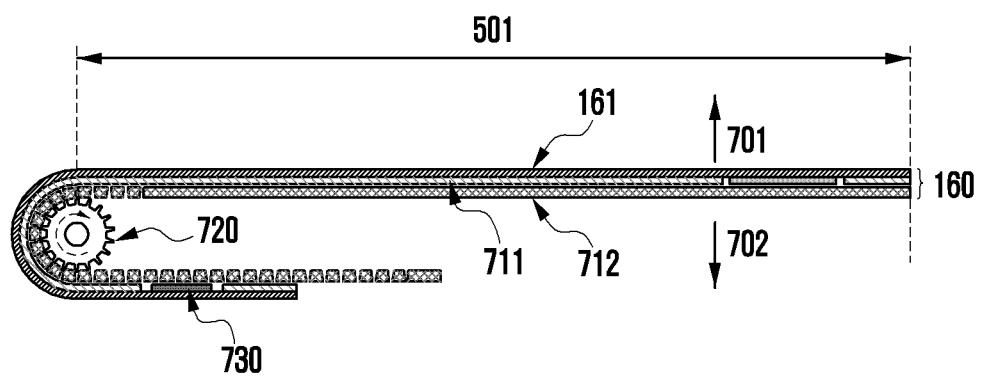
FIGS. 7A to 7C are diagrams illustrating an example state change of an electronic device according to certain embodiments of the disclosure.
Figure 7B:
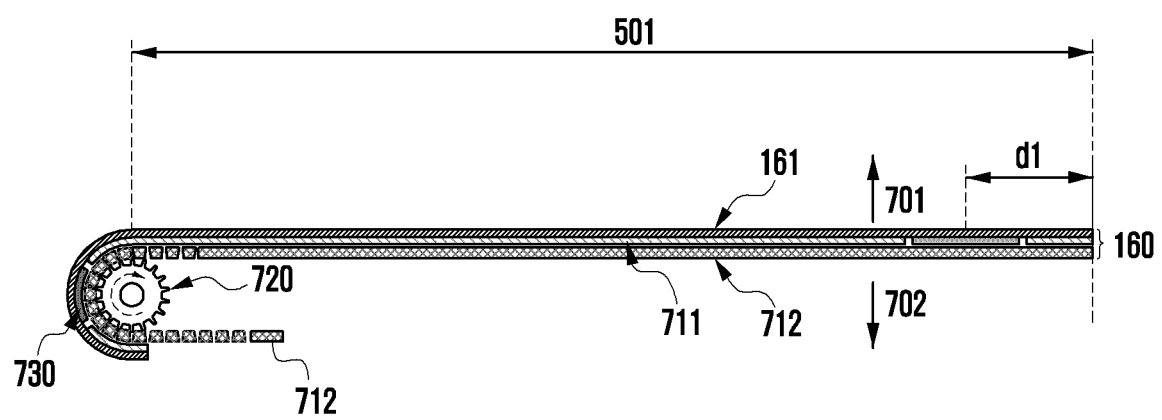
Figure 7C:
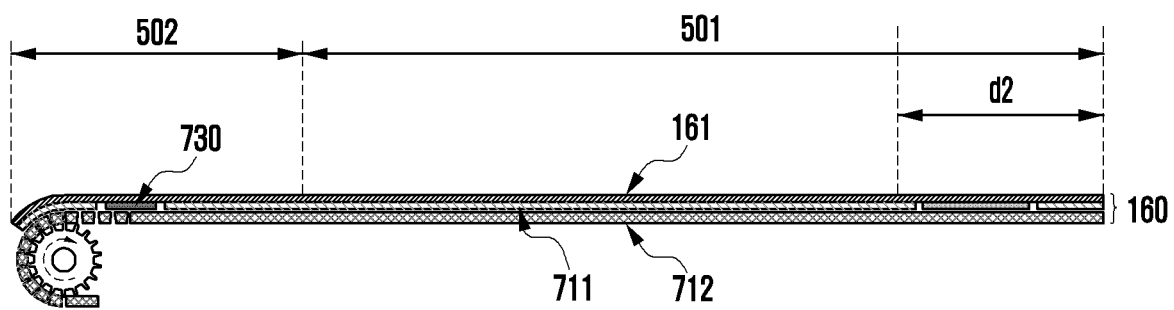

FIGS. 7A to 7C are diagrams illustrating the state change of the electronic device 101 according to certain embodiments of the disclosure.

The display module 160 may include a display panel 161, a shielding member 711, and a metal plate 712.

The display panel 161 may display an image and/or a screen as a flexible display.

The display panel 161 may face a front surface 701 of the electronic device 101, and the metal plate 712 may face a rear surface 702 of the electronic device 101.

A shielding member 711 may serve as step difference compensation when the display panel 161 is coupled to the metal plate 712. The shielding member 711 may be implemented using a conductive member that prevents the components of the electronic device 101 disposed below the metal plate 712 from affecting the display panel 161.

The metal plate 712 may be combined with a sliding structure 720. The metal plate 712 may be moved when the sliding structure 720 is rotated. The metal plate 712 may be coupled to the display panel 161 to move together.

In FIG. 7A, when the electronic device 101 is in a first state (e.g., closed state), the AOA antenna 730 may be oriented to face the rear surface 702 of the electronic device 101. The electronic device 101 may display the basic screen 501 in the first state.

FIG. 7B is a diagram illustrating the AOA antenna 730 in a bending section of the flexible display, when the electronic device 101 is extended in the first state (or reduced in the second state).

In FIG. 7B, when the electronic device 101 is extended in the first state (or reduced in the second state), the AOA antenna 730 may be disposed within the bending section. When the AOA antenna 730 is moved by the sliding action, bending stress may be reduced and the curvature length may be limited to prevent separation of the AOA antenna 730 from the display module 160. Accordingly, the AOA antenna 730 may formed to have a length of curvature smaller than the curvature length of the display panel 161 or the display module 160 in the bending section.

When the electronic device 101 is extended in the first state (or reduced in the second state), the electronic device 101 may further display a screen area, as extended by a first extended length d1.

In FIG. 7C, when the electronic device 101 is in the second state (e.g., open state), the AOA antenna 730 may be oriented to face the front surface 701 of the electronic device 101. When the electronic device 101 transitions into the second state, the electronic device 101 may add and display the extended screen area 502 corresponding to a second extended length d2.

Figure 8A:
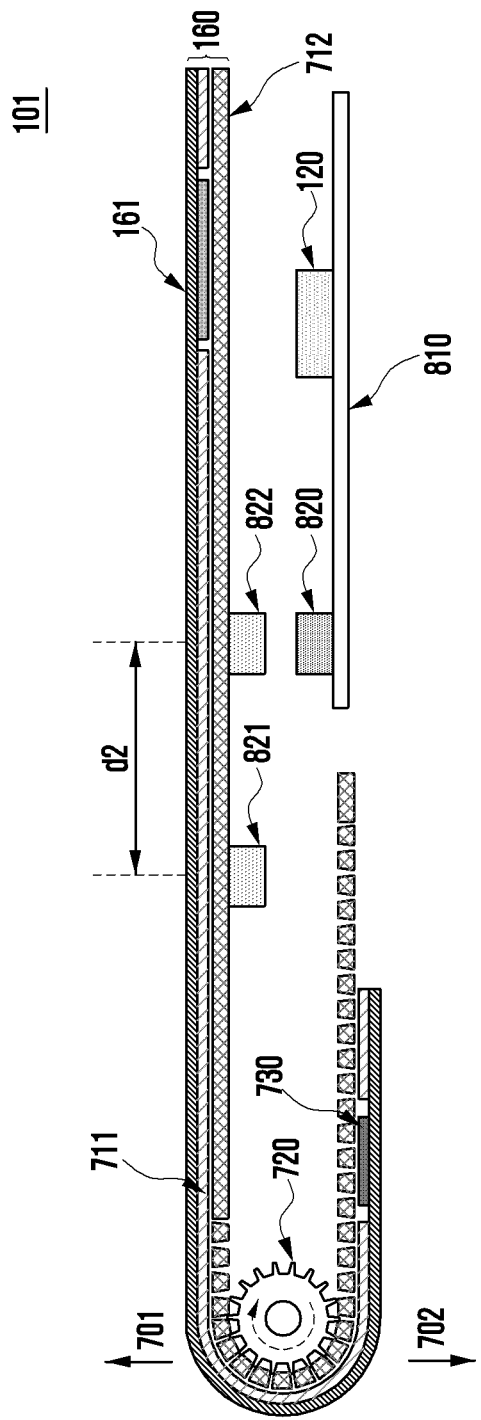
FIGS. 8A and 8B are diagrams illustrating an example method of detecting a state change of an electronic device according to certain embodiments of the disclosure.
Figure 8B:
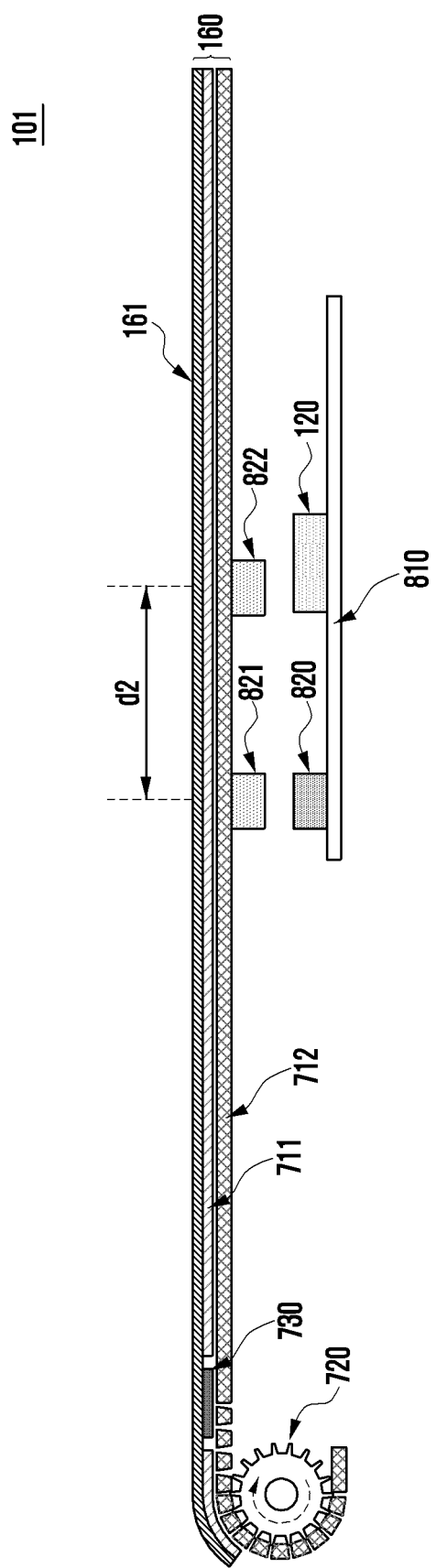

FIGS. 8A and 8B are diagrams illustrating a method of detecting the state change of the electronic device 101 according to certain embodiments of the disclosure.

FIGS. 8A to 8B have the same components as FIGS. 7A to 7B, and additionally show components such as a first magnet 821 and a second magnet 822, a printed circuit board 810, the processor 120, and a hall effect sensor 820.

Referring to FIG. 8A, the electronic device 101 may include a Hall sensor 820 disposed on the printed circuit board 810. The Hall sensor 820 may transmit information regarding a detected magnetic force change to the processor 120. The printed circuit board 810 may be disposed in a lower area of the display module 160 (or in the housing of the electronic device 101). The first magnet 821 and the second magnet 822 may be disposed on at least a portion of the metal plate 712. The second magnet 822 may be disposed on at least a portion of the metal plate 712 corresponding to the Hall sensor 820, and the first magnet 821 may be disposed on the at least a portion of the metal plate 712 spaced apart from the second magnetic 822 by the second extended length d2. In this case, as shown in FIG. 8A, when the electronic device 101 is in the first state (closed state), the first magnet 821 does not align to the printed circuit board 810, and instead aligns with the at least a portion of the metal plate 712 disposed on the rear surface 702. The processor 120 disposed on the printed circuit board 810 may be disposed to be spaced apart from the Hall sensor 820 by the second extended length d2.

Referring to FIG. 8B, when the electronic device 101 is changed from the first state to the second state, the first magnet 821 may align with the Hall sensor 820, and the second magnet 822 may align the processor 120. When the electronic device 101 is changed from the first state to the second state, the display module 160 may move by the second extended length d2. Because the printed circuit board 810 fixed to the housing of the electronic device 101 does not move, the first magnet 821 and the second magnet 822 disposed on the metal plate 712 of the display module 160 may move relative to the Hall sensor 820 and the processor 120.

Thus, the processor 120 may detect the state of the electronic device 101 based on information on the open state and/or closed state, according to the magnetic force change detected by the Hall sensor 820 and/or the processor 120 via alignment with either the first magnet 821 or the second magnet 822.

Figure 9:
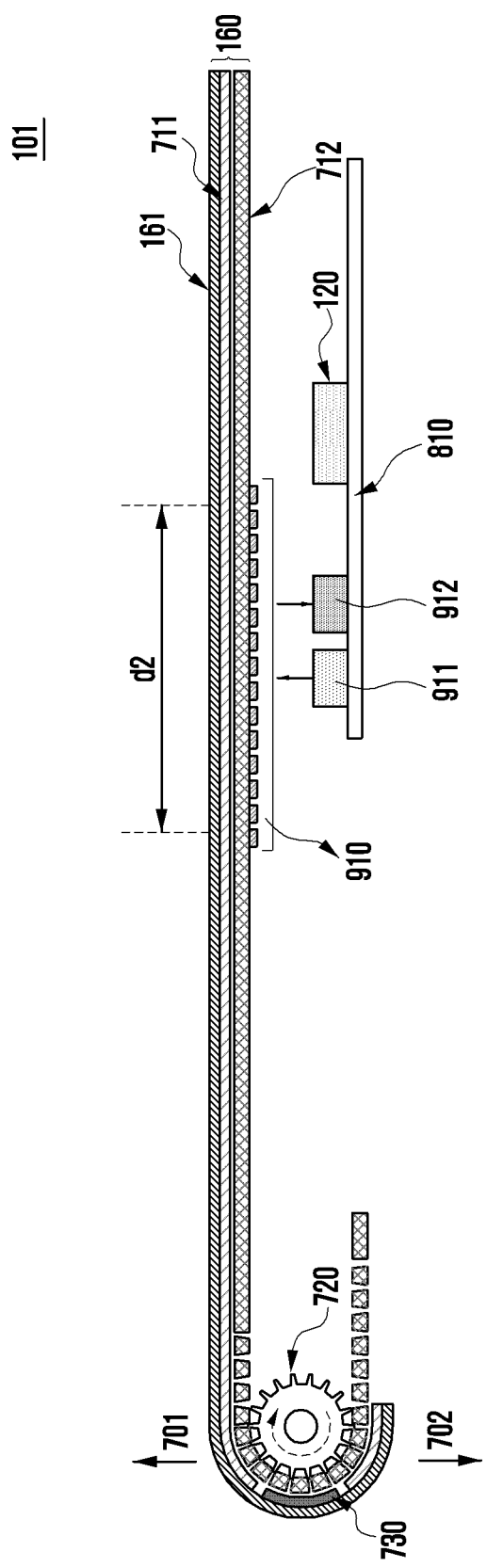
FIG. 9 is a diagram illustrating an example method of detecting a state change of an electronic device according to certain embodiments.

FIG. 9 is a diagram illustrating a method of detecting the state change of the electronic device 101 according to certain embodiments.

FIG. 9 may have the same components as FIGS. 7A to 7B, and also additionally include components such as a detection pattern 910, a printed circuit board 810, the processor 120, a first optical sensor 911, and a second optical sensor 912. When a state change of the electronic device 101 are detectable using the detection pattern 910, the electronic device 101 may recognize not only the open state and/or closed state of the electronic device 101, but also an intermediate state thereof in the midst of a transition to the open state and/or closed state.

Referring to FIG. 9, the electronic device 101 may include a first optical sensor 911 and a second optical sensor 912 on the printed circuit board 810. The metal plate 712 may include the detection pattern 910 in at least a portion thereof. The detection pattern 910 may be disposed on at least a portion of the metal plate 712 and oriented to face the printed circuit board 810 included in the electronic device 101. The detection pattern 910 may include a pattern length of the second extended length d2. The detection pattern 910 may include, for example, an uneven pattern. The first optical sensor 911 and the second optical sensor 912 may include infrared sensors. The first optical sensor 911 and the second optical sensor 912 may include, for example, an emitter that outputs infrared rays, and a receiver that receives reflected infrared rays. In certain embodiments, the first optical sensor 911 may include the emitter and the second optical sensor 912 may include the receiver. The first optical sensor 911 and the second optical sensor 912 may irradiate light towards the detection pattern 910, and may transmit data obtained by counting a change in the reflected light to the processor 120. The processor 120 may detect the state of the electronic device 101 based on the data received from the first optical sensor 911 and the second optical sensor 912.

In certain embodiments, when the electronic device 101 executes a sliding or rolling operation of the display module 160 using a driving unit (or a rolling actuator), the electronic device 101 may determine a slide length to determine whether the electronic device 101 is disposed in the open state, the closed state, and/or the intermediate state, based on the number of rotations of the motor of the driving unit and the rotation time thereof.

Figure 10:
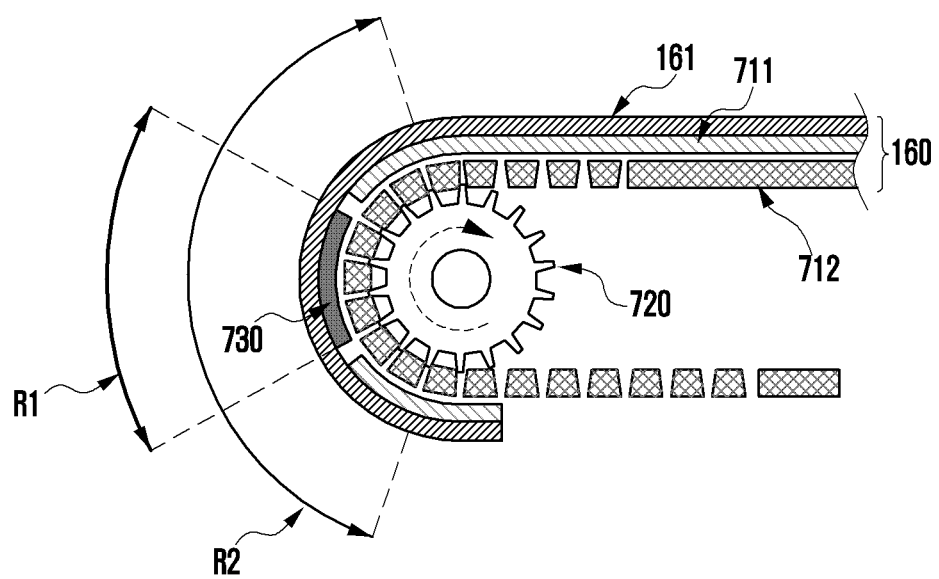
FIG. 10 is a diagram illustrating an example curvature of an AOA antenna according to certain embodiments of the disclosure.

FIG. 10 is a diagram illustrating the curvature of an AOA antenna according to certain embodiments of the disclosure.

The AOA antenna 730 may have a curvature of a length smaller than a curvature length of the display panel 161 or the display module 160 in a bending section. In the bending section, the bending length of the AOA antenna 730 may be R1 and the bending length of the display module 160 may be R2. R1 may be smaller than R2. The AOA antenna 730 may include a curvature smaller than the curvature of the display module 160, so that it is possible to reduce the repulsive force of separation due to the curvature when the AOA antenna 730 is moving within the bending section.

Figure 11:
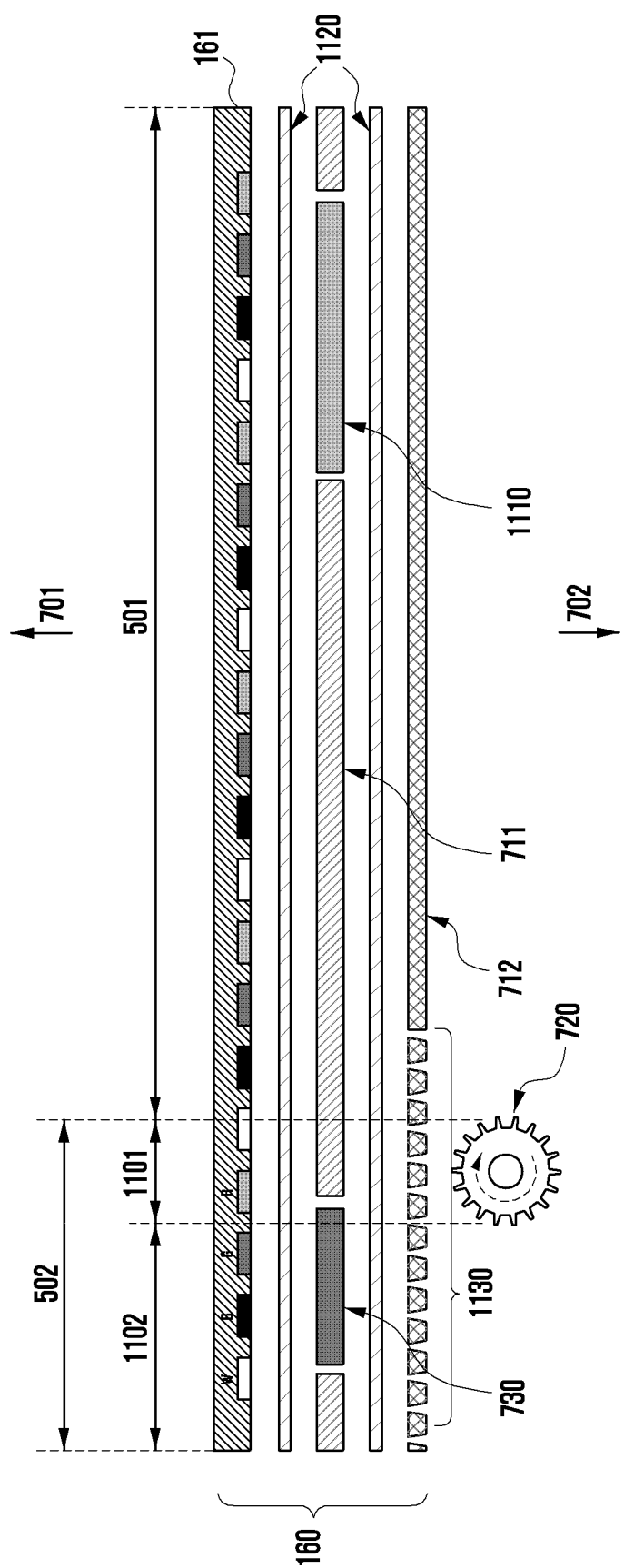
FIG. 11 is a diagram illustrating an example layer of a display module according to certain embodiments of the disclosure.

FIG. 11 is a diagram illustrating a layer of the display module 160 according to certain embodiments of the disclosure.

The display module 160 may include a basic screen 501 (e.g., an initial or first screen area) that is exposed and visible from an exterior of the electronic device 101 (e.g., constantly exposed) and an extended screen 502 that is selectable exposed according to whether the electronic device 101 is disposed in the open or closed state. The extended screen 502 may be exposed to the exterior of the electronic device 101 in an open state of the electronic device 101.

The extended screen 502 may include a bending area 1101 and a planar area 1102. The bending area 1101 is maintained in a bent state in the closed state of the electronic device 101, and is continuous with a basic screen area. The planar area 1102 is an area that is maintained e, and is continuous with the bending area 1101.

When the electronic device 101 is transitioned from the closed state to the open state, or from the open state to the closed state, the planar area 1102 may be at least partially bent by rotating around the sliding structure 720.

In the closed state of the electronic device 101, at least a portion (e.g., the planar area 1102) of the extended screen 502 may be oriented to face the rear surface 702 of the electronic device 101, and in the open state, the at least the portion (e.g., the planar area 1102) thereof may be oriented to face the front surface 701 of the electronic device 101.

The sliding structure 720 may include a roller, and may be further operatively coupled to a gear structure 1130 included in the at least a portion of the metal plate 712 to facilitate linear movement of the display module 160 through the rotation.

The display module 160 may include a plurality of layers, which may be arranged in a prespecified order, such as the display panel 161, the shielding member 711, and then the metal plate 712. The display panel 161 may be configured to display a screen and other assorted imagery according to the control of the processor 120 and/or a display driver IC 1110.

The display panel 161 may include a transparent layer in an external exposure direction, and may further include an opaque layer (e.g., an "EMBO" layer) in an internal direction of the electronic device 101. The transparent layer may protect the surface of the display panel 161, and the opaque layer may prevent a component (e.g., the AOA antenna 730) disposed below the display panel 161 from being visible from an exterior of the electronic device.

The display panel 161 may be coupled to the shielding member 711 using an adhesive member 1120.

The shielding member 711 may provide step difference compensation when the display panel 161 is coupled to the metal plate 712. The shielding member 711 may be conductive, which may prevent components of the electronic device 101 disposed below the metal plate 712 from interfering with the display panel 161.

The shielding member 711 may include the display driver IC 1110 and the AOA antenna 730 in at least a partial area thereof. The display driver IC 1110 may be disposed on the basic area 501. The AOA antenna 730 may be disposed on the extended screen 502.

The shielding member 711 may be coupled to the display panel 161 and the metal plate 712 using an adhesive member 1120.

The metal plate 712 may be formed a separate plate structure, and may include a multi-bar structure, and a general plate portion lacking a multi-bar structure, the two being mechanically combined with each other.

In certain embodiments, the metal plate 712 may be implemented as a multi-hole structure on a thin plate, and some holes may be rotationally moved in engagement with a roller (e.g., the sliding structure 720).

The metal plate 712 may be coupled to the shielding member 711 using the adhesive member 1120.

Figure 12:
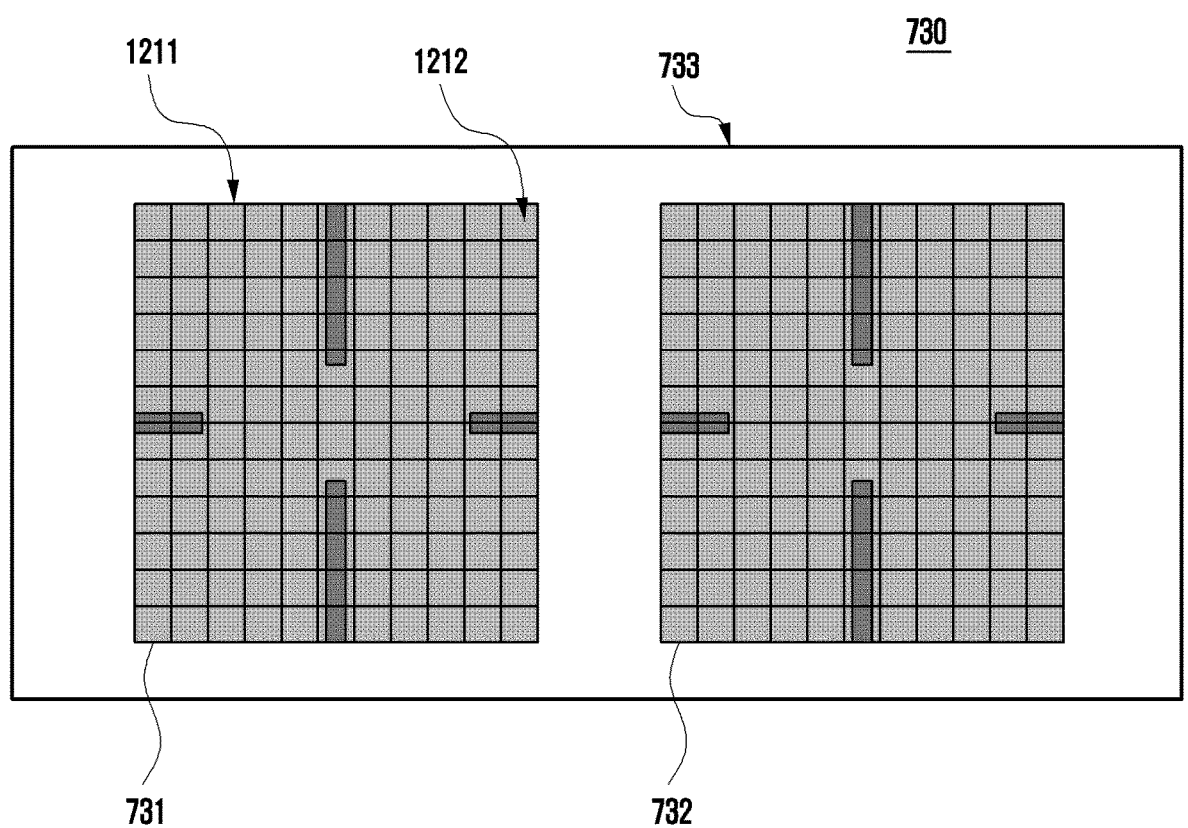
FIG. 12 is a diagram illustrating an example AOA antenna according to certain embodiments of the disclosure.

FIG. 12 is a diagram illustrating the AOA antenna 730 according to certain embodiments of the disclosure.

The AOA antenna 730 may include a plurality of antenna elements disposed on a flexible printed circuit board (FPCB, 733). The AOA antenna 730 may include a first antenna element 731 and a second antenna element 732. In certain embodiments, the AOA antenna may further include a third antenna element.

Each of the first antenna element 731 and the second antenna element 732 may be implemented using multiple layers. The first antenna element 731 and the second antenna element 732 may be patch antennas. The first antenna element 731 and the second antenna element 732 may include a ground layer 1211 and a signal layer 1212. The ground layer 1211 may have a mesh shape. In certain embodiments, the ground layer 1211 may remove a conductive member on grid lines and may form the conductive member on the remaining portion. The signal layer 1212 may form a crosshair-shaped no-signal area and a butterfly-shaped signal area with square wings.

Figure 13:
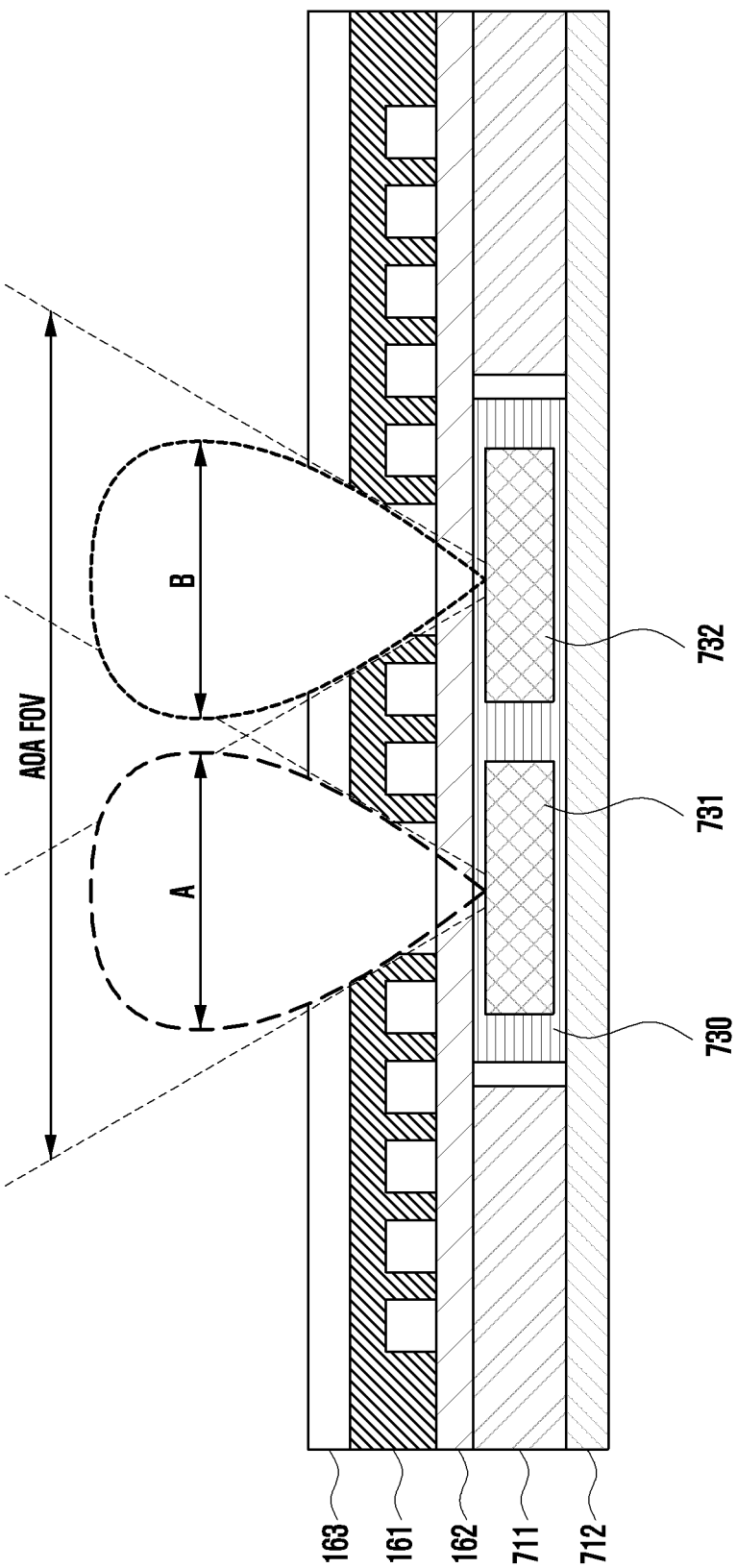
FIG. 13 is a diagram illustrating an example configuration and operation of an AOA antenna according to certain embodiments of the disclosure.

FIG. 13 is a diagram illustrating the configuration and operation of the AOA antenna 730 according to certain embodiments of the disclosure.

The display panel 161 may further include a transparent layer 163 and an opaque layer (e.g., an EMBO layer).

The shielding member 711 may include the AOA antenna 730 in at least a partial area thereof. The AOA antenna 730 may include a plurality of antenna elements 731 and 732. The AOA antenna 730 may include a directional antenna. Each of the first antenna element 731 and the second antenna element 732 may include a patch antenna. The first antenna element 731 may output a first beam A, and the second antenna element 732 may output a second beam B. A directivity direction and a directivity angle may be obtained within a range of −60 degrees to +60 degrees with respect to the first beam A and the second beam B. A field of view (FOV) of the AOA antenna 730 may correspond to the beam directivity angles for the first beam A and the second beam B.

The shielding member 711 may be disposed between the display panel 161 and the metal plate 712. In certain embodiments, the AOA antenna 730 may be disposed between the display panel 161 and the metal plate 712.

In certain embodiments, the first antenna element 731 and the second antenna element 732 may perform a communication transmission/reception function. In certain embodiments, at least one of the first antenna element 731 and the second antenna element 732 may perform a communication reception function, and the other thereof may perform a communication transmission/reception function.

Figure 14:
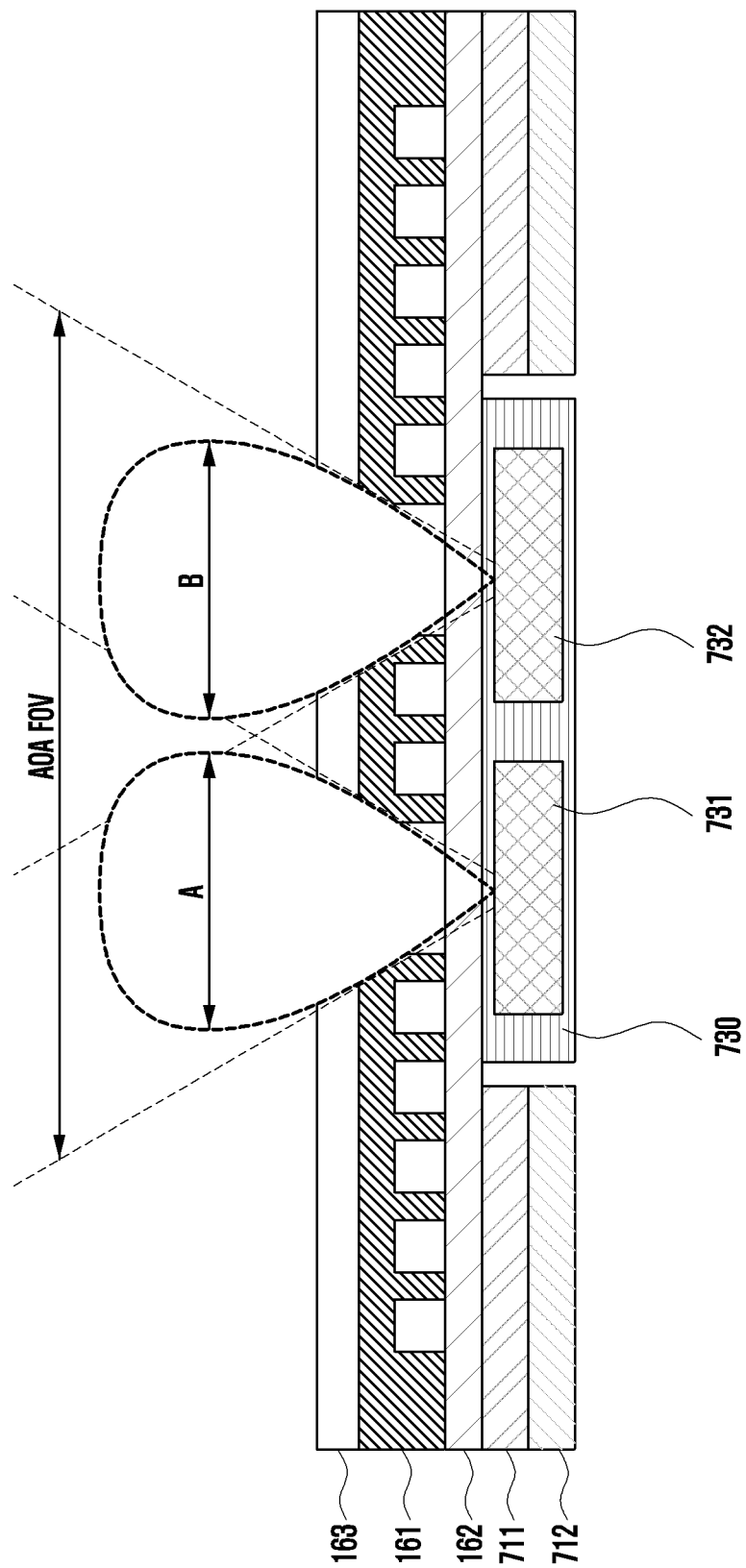
FIG. 14 is a diagram illustrating an example configuration and operation of an AOA antenna according to certain embodiments of the disclosure.

FIG. 14 is a diagram illustrating the configuration and operation of the AOA antenna 730 according to certain embodiments of the disclosure.

The AOA antenna 730 of FIG. 14 has the same components as that of FIG. 13, but the arrangement therein of the AOA antenna 730 may be different, as will be discussed below.

The AOA antenna 730 may be disposed below the display panel 161. The shielding member 711 and the metal plate 712 may include the AOA antenna 730 in at least a partial area thereof. The metal plate 712 may further define an opening in which the AOA antenna 730 may be disposed. Since the metal plate 712 of FIG. 14 further defines the opening (e.g., unlike the metal plate 712 of FIG. 13) for receiving the AOA antenna 730, the AOA antenna 730 of FIG. 14 may thicker than the AOA antenna 730 of FIG. 13. In this case, the relatively thicker AOA antenna 730 of FIG. 14 may demonstrate an increase in antenna gain in comparison to the AOA antenna 730 of FIG. 13.

Figure 15:
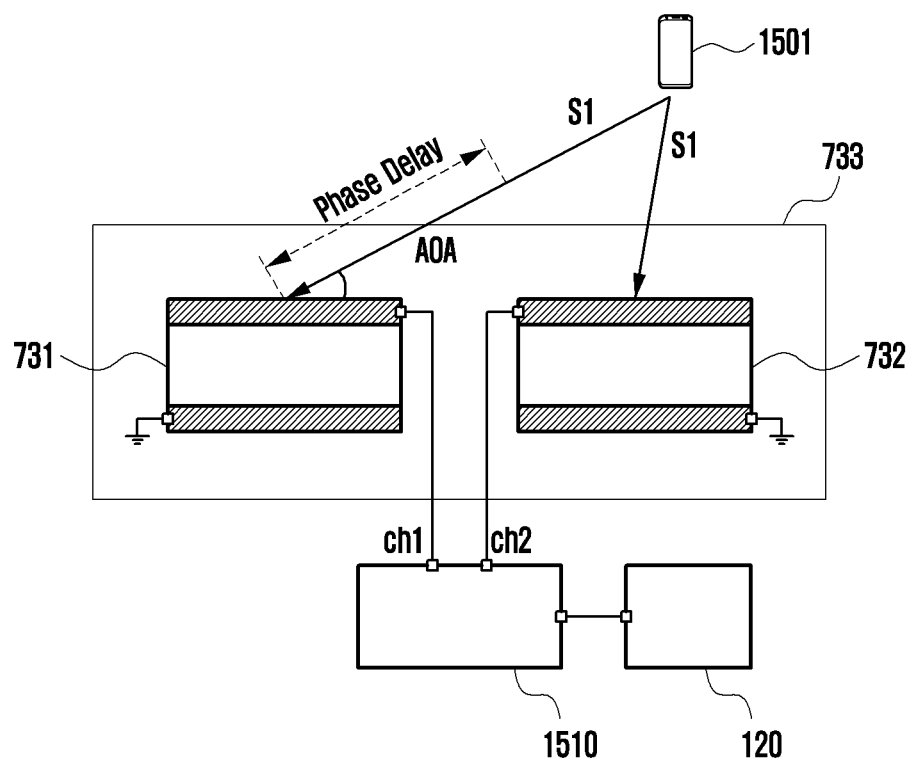
FIG. 15 is a diagram illustrating an example operation of an AOA antenna of an electronic device according to certain embodiments of the disclosure.

FIG. 15 is a diagram illustrating an operation of the AOA antenna 730 of the electronic device 101 according to certain embodiments of the disclosure.

The AOA antenna 730 may include the FPCB 733, the first antenna element 731 and the second antenna element 732. The first antenna element 731 and the second antenna element 732 may be disposed on the FPCB 733.

At least one of the first antenna element 731 and the second antenna element 732 may operate as a communication transmission/reception channel, and the other thereof may operate as a reception channel.

Each of the first antenna element 731 and the second antenna element 732 may be connected to a communication circuitry 1510 (e.g., the communication module 190 of FIG. 1). The communication circuitry 1510 may include ultra-wide band communication circuitry. The communication circuitry 1510 may transmit a message related to location measurement to an external electronic device 1501 through the first antenna element 731 and/or the second antenna element 732 using an asynchronous communication method. When receiving the location measurement message from the electronic device 101, the external electronic device 1501 may transmit a response message to the electronic device 101. The electronic device 101 may receive the response message S1 of the external electronic device 1501 through the first antenna element 731 and/or the second antenna element 732. The communication circuitry 1510 may perform communication using, for example, one of four channels of a 6-8 GHz band.

The communication circuitry 1510 may transmit phase information of the signal received through the first antenna element 731 and/or the second antenna element 732 to the processor 120. The processor 120 may detect a relative direction between the external electronic device 1501 and the electronic device 101 based on the received phase information of the signal.

The communication circuitry 1510 may transmit time information of the signal received through the first antenna element 731 and/or the second antenna element 732 to the processor 120. The processor 120 may detect a relative distance between the external electronic device 1501 and the electronic device 101 based on the received time information of the signal.

Figure 16:
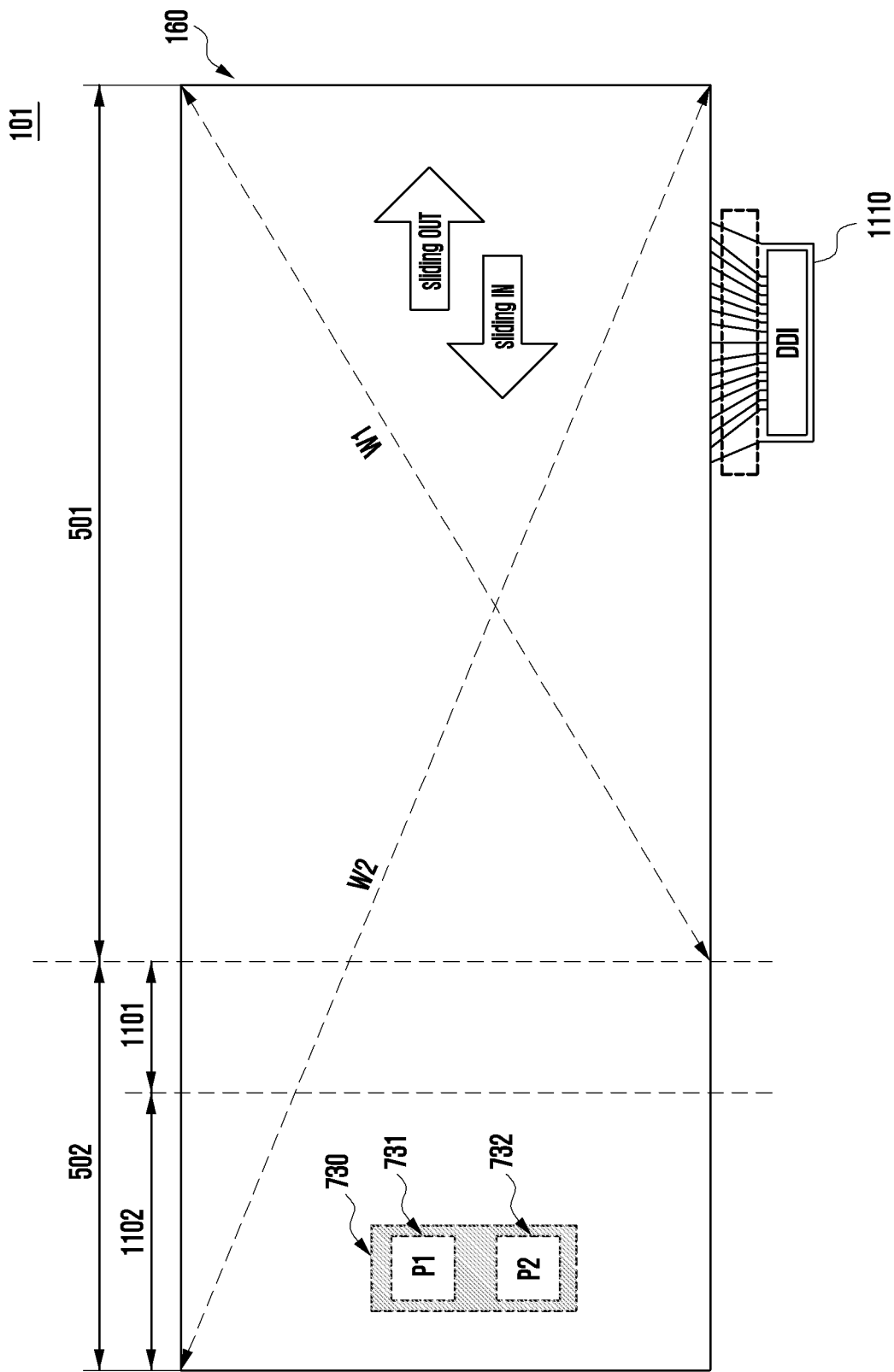
FIG. 16 is a diagram illustrating an example aspect ratio of a display module and the arrangement of an AOA antenna according to the disclosure.

FIG. 16 is a diagram illustrating the aspect ratio of the display module 160 and the arrangement of the AOA antenna 730 according to the disclosure.

In a closed state, the electronic device 101 may utilize for display the basic screen area 501, having a first ratio W1. For example, the first ratio W1 (i.e., a horizontal to vertical ratio) may be 16:9. In an open state, the electronic device 101 may display a screen using the basic screen area 501 and the extended screen area 502. The basic screen 501 and the extended screen 502 may have a second ratio W2. For example, the second ratio W2 may be 21:9.

In certain embodiments, the electronic device 101 may extend the display module 160 via a sliding articulation. When the display module 160 is extended by sliding, the extended screen 502 may be extended, which in some configurations may be up to twice the size of the basic screen.

The AOA antenna 730 disposed in the extended screen (e.g., the extended screen area) and/or the planar area 1102 may, be disposed such that the first antenna element 731 and/or the second antenna element 732 are arranged in a line. The first antenna element 731 and/or the second antenna element 732 may be arranged in a line formation, oriented in a vertical and/or horizontal direction (e.g., row or column), to receive a signal. The processor 120 may utilize a phase difference between the signals received from the first antenna element 731 and/or the second antenna element 732 arranged in a line to obtain a relative direction (or azimuth) between the electronic device 101 and the external electronic device. The display module 160 may display a screen under the control of the display driver IC 1110.

Figure 17:
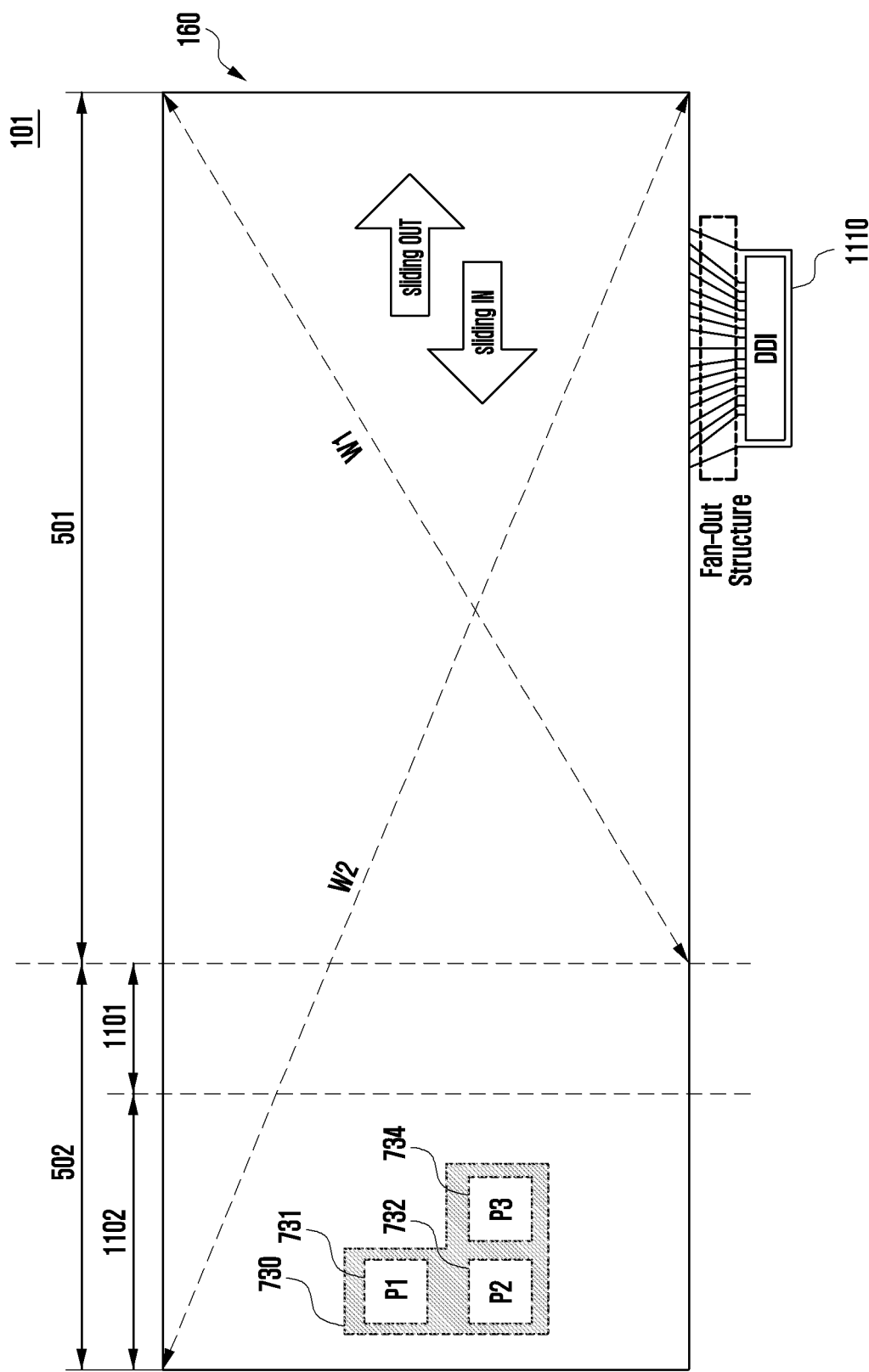
FIG. 17 is a diagram illustrating an example aspect ratio of a display module and the arrangement of an AOA antenna according to the disclosure.

FIG. 17 is a diagram illustrating the aspect ratio of the display module 160 and the arrangement of the AOA antenna 730 according to the disclosure.

The AOA antenna 730 of FIG. 17 may further include a third antenna element 734 within the AOA antenna 730 of FIG. 16, and the remaining components are the same.

The AOA antenna 730 disposed in the extended screen 502 (e.g., the extended screen area) and/or the planar area 1102 may include the first antenna element 731 and/or the second antenna element 732 arranged in a line. The AOA antenna 730 may include the second antenna element 732 and/or the third antenna element 734 arranged in a line. In certain embodiments, the first antenna element 731 and/or the second antenna element 732 may be arranged in a line in a first direction, and the second antenna element 732 and/or the third antenna element 734 may be arranged in a line in a second direction. The first direction and the second direction may vertically intersect on a plane. For example, the first direction may be a y-axis direction, and the second direction may be an x-axis direction.

The first antenna element 731, the second antenna element 732, and/or the third antenna element 734 may be arranged in a line in a vertical and/or horizontal direction (e.g., as a column or a row) to receive signals. The processor 120 may use a phase difference detected between the signal received from the first antenna element 731, the second antenna element 732, and/or the third antenna element 734 (as arranged in a line) to obtain information on a relative direction (or azimuth) between the electronic device 101 and the external electronic device.

When the electronic device 101 includes the first antenna element 731, the second antenna element 732, and/or the third antenna element 734 as the AOA antenna 730, the patch antenna (the first antenna element 731, the second antenna element 732, and/or the third antenna element 734) may be selectively activated in order to increase the positional accuracy of detection, for both the portrait mode and the landscape mode.

For example, the electronic device 101 may activate a portion of the patch antenna (the first antenna element 731, the second antenna element 732, and/or the third antenna 734) that aligns with an axis perpendicular to the vertical/horizontal mounting mode. When the electronic device 101 is disposed in the portrait mode, the first antenna element 731 and/or the second antenna element 732 may be activated. When the electronic device 101 is disposed in the landscape mode, the second antenna element 732 and/or the third antenna element 734 may be activated.

In certain embodiments, the first antenna element 731, the second antenna element 732, and/or the third antenna element 734 may be arranged in a triangular shape to receive signals. The processor 120 may utilize a phase difference between the signals received from each of the first antenna element 731, the second antenna element 732, and/or the third antenna element 734 arranged in the triangular shape to obtain information on a relative direction (or azimuth) between the electronic device 101 and the external electronic device.

In certain embodiments, the processor 120 may obtain information on the relative elevation between the electronic device 101 and the external electronic device, using a phase difference between the signals received from the first antenna element 731, the second antenna element 732, and/or the third antenna element 734 arranged in the line.

In order to calculate the relative elevation between the electronic device 101 and the external electronic device, the first antenna element 731, the second antenna element 732, and/or the third antenna element 734 may simultaneously receive signals from the external electronic device.

The electronic device 101 may obtain the information on the relative direction (azimuth) between the electronic device 101 and the external electronic device from signals received via two antennas (e.g., the first antenna element 731 and the second antenna element 732) aligned in the vertical axis, and may obtain information on a relative elevation from the two antennas (e.g., the second antenna element 732 and/or the third antenna element 734) as aligned in the horizontal axis. A method of obtaining AOA information using the first antenna element 731, the second antenna element 732, and/or the third antenna element 734 may be referred to as 3D AOA, and a method of obtaining AOA information using the first antenna element 731 and/or the second antenna element 732 may be referred to as "2D AOA."

Figure 18:
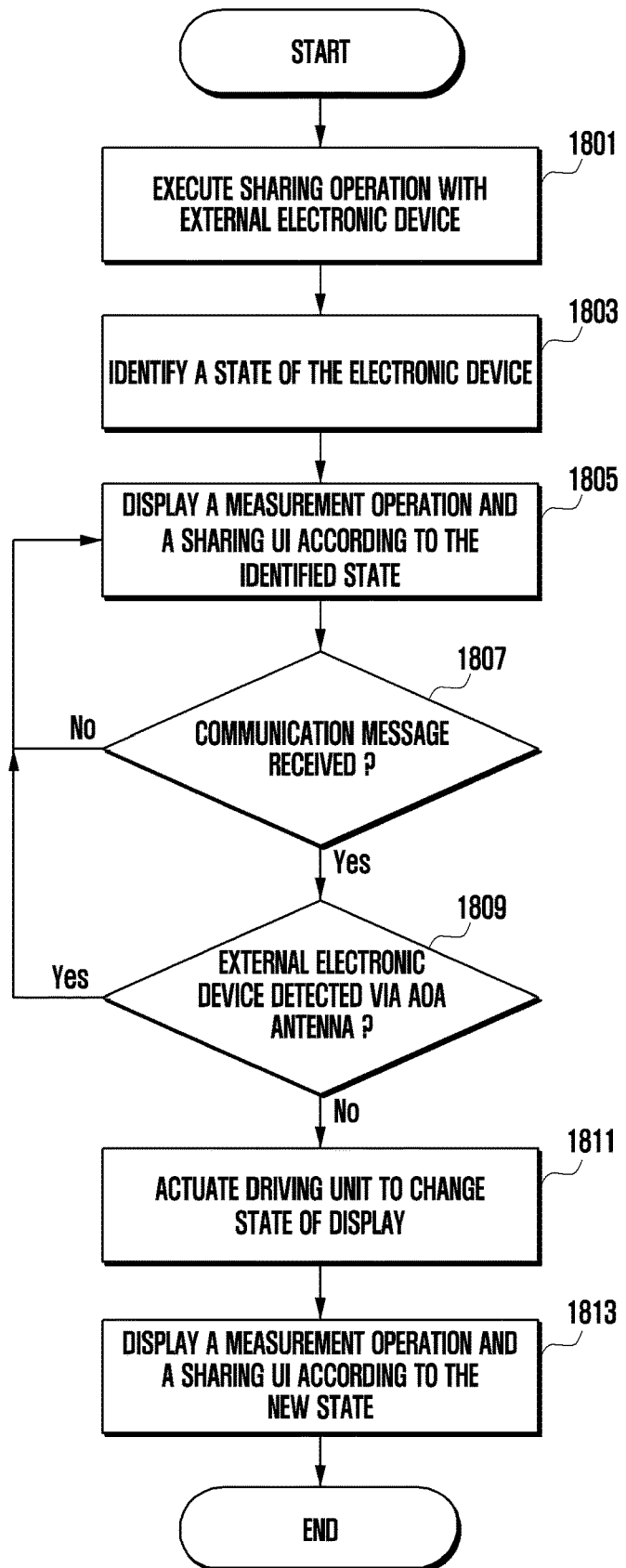
FIG. 18 is a block diagram illustrating an example method of displaying a user interface of an electronic device according to certain embodiments of the disclosure.

FIG. 18 is a block diagram illustrating a method of displaying a user interface of the electronic device 101 according to certain embodiments of the disclosure.

In operation 1801, the electronic device 101 may perform a sharing operation with an external electronic device under the control of the processor 120. The electronic device 101 may execute an AOA (angle of arrival) antenna included in the electronic device 101 for sharing with the external electronic device. For example, the electronic device 101 may share an image, a screen, and/or communication with the external electronic device. The electronic device 101 may execute a user interface related to the sharing operation in order to share an image, screen, and/or communication with the external electronic device.

In operation 1803, the electronic device 101 may identify the state of the electronic device 101 under the control of the processor 120. The electronic device 101 may extend or reduce the display module 160 including the flexible display. When the display module 160 of the electronic device 101 is extended, the electronic device 101 may be in an open state (or an extended state). When the display module 160 of the electronic device 101 is not extended and is in a basic state, the electronic device 101 may be in a closed state (or a basic state). The electronic device 101 may determine the extended and/or basic state of the display module 150 based on signals detected from sensors under the control of the processor 120, and may identify the state of the electronic device 101.

In operation 1805, the electronic device 101 may display a positioning operation and a sharing interface on the display module 160 according to the identified state under the control of the processor 120.

In certain embodiments, the electronic device 101 may perform a positioning operation using the AOA antenna according to the state of the electronic device 101. For example, the electronic device 101 may measure the relative position and/or direction of the external electronic device spaced apart from the electronic device 101 using the AOA antenna.

The directional position of the AOA antenna may be changed according to the state of the electronic device 101. For example, when the AOA antenna is in the closed state of the electronic device 101, the AOA antenna may face the rear surface of the electronic device 101. When the electronic device 101 is in the closed state, the electronic device 101 may measure the relative position and/or direction of the external electronic device in the rear direction of the electronic device 101.

For example, when the AOA antenna is in the open state of the electronic device 101, the AOA antenna may face the front surface of the electronic device 101. When the electronic device 101 is in the open state, the electronic device 101 may measure the relative position and/or direction of the external electronic device in the front direction of the electronic device 101.

In certain embodiments, the electronic device 101 may display the sharing interface on the display module 160 according to the state of the electronic device 101.

In certain embodiments, the AOA antenna may face the rear surface of the electronic device 101 when the electronic device 101 is in the closed state. When the electronic device 101 is in the closed state, the electronic device 101 may measure the relative position and/or direction of the external electronic device in the rear direction of the electronic device 101 and may display information on the relative position and/or direction of the external electronic device on the display module 160 through the user interface.

In certain embodiments, the AOA antenna may face the front surface of the electronic device 101 when the electronic device 101 is in the open state. When the electronic device 101 is in the open state, the electronic device 101 may measure the relative position and/or direction of the external electronic device in the front direction of the electronic device 101 and may display information on the relative position and/or direction of the external electronic device on the display module 160 through the user interface.

In operation 1807, the electronic device 101 may determine whether reception of a communication message from the external electronic device is detected under the control of the processor 120.

The communication message may be configured to establish communication linkage, and may include, for example, a Bluetooth low energy (BLE) and/or Bluetooth communication pairing message. The BLE and/or Bluetooth communication pairing message may include an advertising packet.

The advertising packet may include ultra-wideband (UWB) communication compatibility information of the external electronic device. The electronic device 101 may identify the UWB communication compatibility information included in the received advertising packet, may activate the AOA antenna 730, and may perform a positioning operation using the AOA antenna 730.

When receiving a communication message from the external electronic device under the control of the processor 120, the electronic device 101 may proceed from operation 1807 to operation 1809.

When the electronic device 101 does not receive the communication message from the external electronic device under the control of the processor 120, the electronic device 101 may return from operation 1807 to operation 1805.

When receiving the communication message from the external electronic device, in operation 1809, the electronic device 101 may determine whether an external electronic device corresponding to the communication message is detected through the AOA antenna under the control of the processor 120.

When the external electronic device corresponding to the communication message is detected through the AOA antenna under the control of the processor 120, the electronic device 101 may proceed from operation 1809 to operation 1805.

When the external electronic device corresponding to the communication message is not detected through the AOA antenna under the control of the processor 120, the electronic device 101 may proceed from operation 1809 to operation 1811.

In operation 1811, the electronic device 101 may change the state of the electronic device 101 by actuating the driving unit under the control of the processor 120 to slide the display.

The driving unit may include a mechanical device that changes the state of the electronic device 101 (e.g., by extending or retracting the display), and/or may rotate the sliding structure 720 of the electronic device 101 to change between the open state and/or the closed state.

In operation 1811, under the control of the processor 120, the electronic device 101 may change the state of the electronic device 101 thereof from the closed state to the open state, or from the closed state to the closed state, via operation of the driving unit.

In certain embodiments, when the state of the electronic device 101 changes from the closed state to the open state, the AOA antenna 730 facing the rear surface 702 may be directed toward the front surface 701 of the electronic device 101.

In certain embodiments, when the state of the electronic device 101 changes from the open state to the closed state, the AOA antenna 730 facing the front surface 701 may be directed toward the rear surface 702 of the electronic device 101.

In certain embodiments, when receiving the communication message from the external electronic device, in operation 1811, the electronic device 101 may request the state change of the electronic device 101 from the user under the control of the processor 120 to change the state of the electronic device 101.

In certain embodiments, the state of the electronic device 101 may be changed by the user's manipulation and/or automatically while the electronic device 101 is displaying a sharing interface in the first state (e.g., closed state).

In operation 1813, the electronic device 101 may display the positioning operation and the sharing interface on the display module 160 according to the changed state under the control of the processor 120.

In certain embodiments, when the electronic device 101 is changed from the open state to the closed state, the electronic device 101 may measure the relative position and/or direction of the external electronic device in the rear direction of the electronic device 101, and may display information on the relative position and/or direction of the external electronic device in the rear direction of the electronic device 101 through the user interface. In this case, the electronic device 101 may display the positioning operation and the user interface on the display module 160 for a predetermined time before the state change.

For example, when the electronic device 101 is changed from the open state to the closed state, a user interface related to the closed state may be displayed. In this case, the electronic device 101 may display the positioning operation and the user interface in the open state on the display module 160 together with the user interface in the closed state for a predetermined time.

In certain embodiments, when the electronic device 101 is changed from the closed state to the open state, the electronic device 101 may measure the relative position and/or direction of the external electronic device in the front direction of the electronic device 101, and may display information on the relative position and/or direction of the external electronic device in the front direction of the electronic device 101 through the user interface. For example, when the electronic device 101 is changed from the closed state to the open state, the electronic device 101 may display a user interface related to the open state. In this case, the electronic device 101 may display the positioning operation and the user interface in the closed state together with the user interface in the open state on the display module 160 for a predetermined time.

Figure 19:
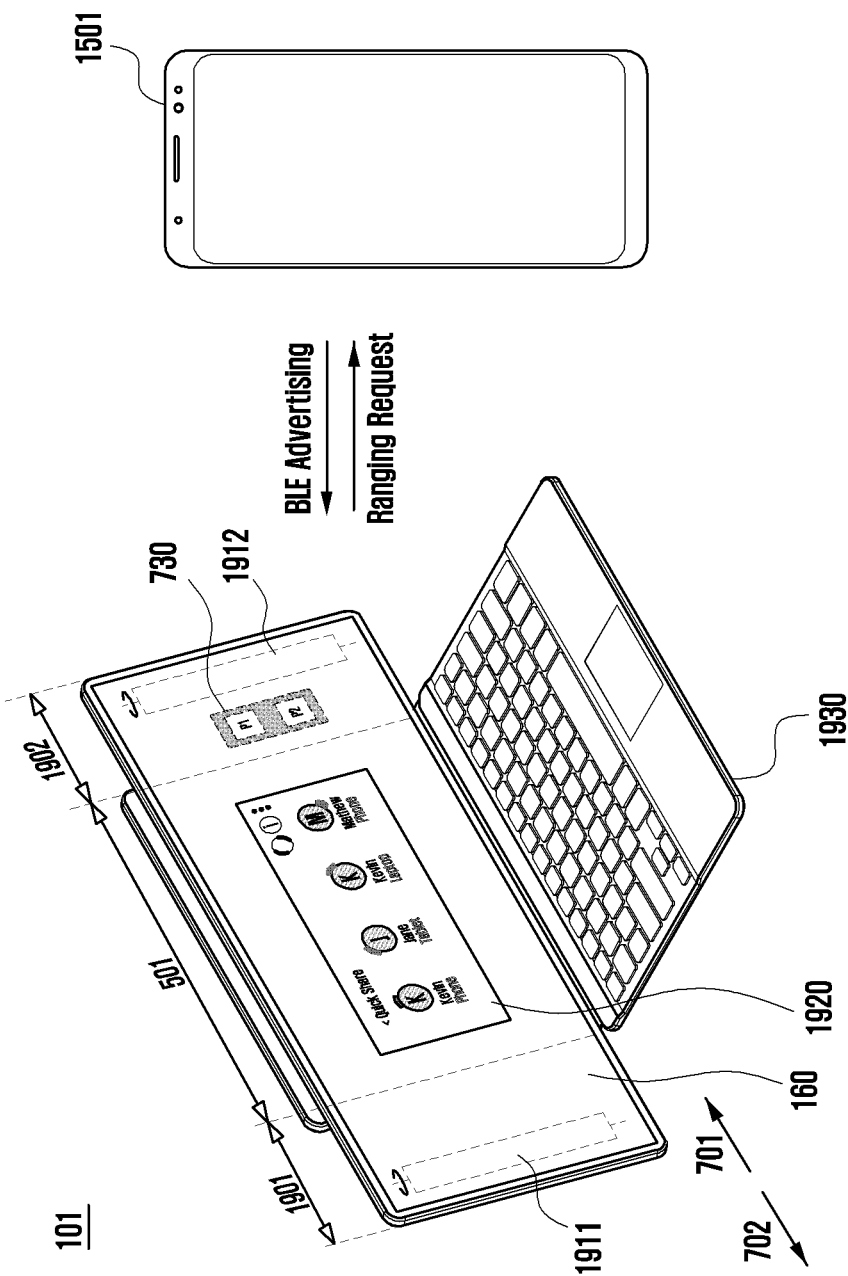
FIG. 19 is a diagram illustrating an example electronic device 101 including a method of displaying the user interface of FIG. 18.

FIG. 19 is a diagram illustrating the electronic device 101 including a method of displaying the user interface of FIG. 18.

When receiving a communication message from the external electronic device 1501, the electronic device 101 may determine whether the external electronic device that transmitted the communication message is detected through the AOA antenna 730 under the control of the processor 120.

When the external electronic device 1501 corresponding to the communication message is detected through the AOA antenna 730, the electronic device 101 may display a sharing interface corresponding to the current state (e.g., the open state or the closed state) of the electronic device 101 on the display module 160.

When the external electronic device 1501 corresponding to the communication message is not detected through the AOA antenna 730, the electronic device 101 may change the state of the electronic device 101 using the driving units 1911 and 1912.

The electronic device 101 may use the driving units 1911 and 1912 to switch the state thereof from the closed state to the open state or from the open state to the closed state.

In certain embodiments, when the state of the electronic device 101 is switched from the closed state to the open state, the AOA antenna 730 facing the rear surface 702 may be oriented to face the front surface 701 of the electronic device 101. In certain embodiments, when the state of the electronic device 101 is switched from the open state to the closed state, the AOA antenna 730 facing the front surface 701 may be oriented face the rear surface 702 of the electronic device 101.

In certain embodiments, when receiving the communication message from the external electronic device, the electronic device 101 may request the state change of the electronic device 101 from the user to change the state of the electronic device 101.

In certain embodiments, whenever the state of the electronic device 101 is changed (e.g., when a sliding operation occurs), the electronic device 101 may perform a positioning operation through the AOA antenna.

In certain embodiments, even when a new device is discovered or connected through BLE, the state of the electronic device 101 may be changed (e.g., the sliding operation occurs), and an automatic positioning operation may be performed through the AOA antenna.

In certain embodiments, the electronic device 101 may include a first extended screen 1901 and/a second extended screen 1902. In the open state, at least one of the first extended screen 1901 and/or the second extended screen 1902 may additionally appear, or both the first extended screen 1901 and/or the second extended screen 1902 may appear.

The electronic device 101 may display the positioning operation and sharing interface 1920 on the display module 160 according to the changed state.

Figure 20:
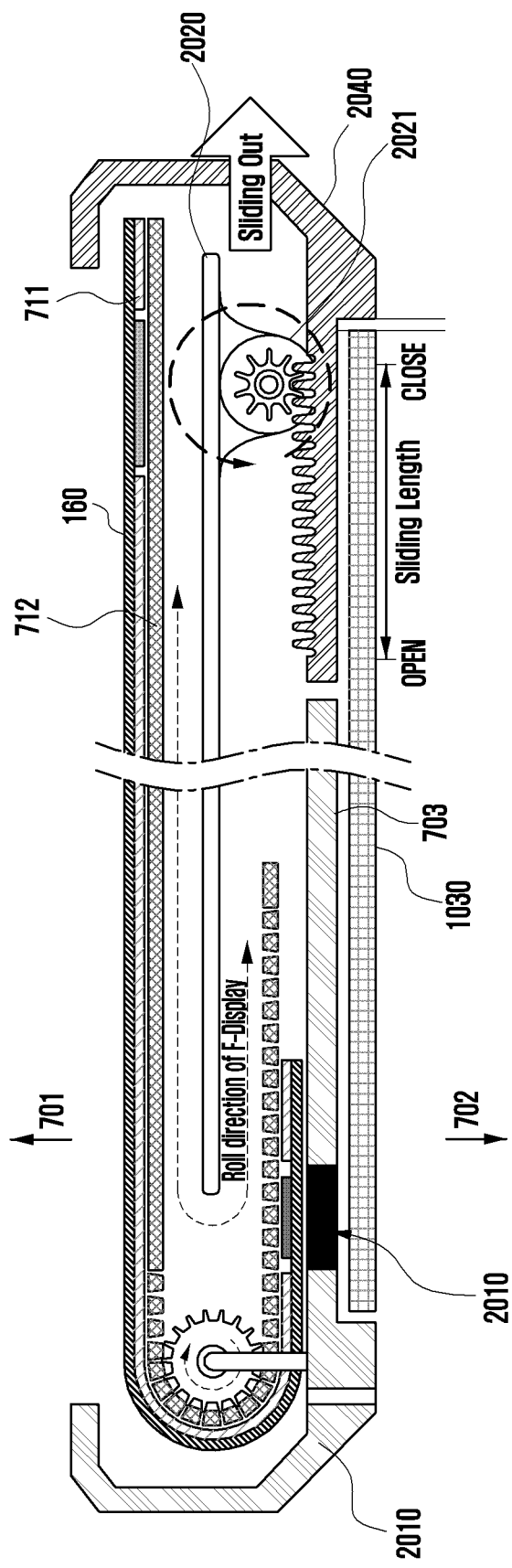
FIG. 20 is a diagram illustrating an example configuration of an electronic device according to certain embodiments of the disclosure.

FIG. 20 is a diagram illustrating the configuration of the electronic device 101 according to certain embodiments of the disclosure.

The electronic device 101 may include a first housing 2010 and a second housing 2040. The first housing 2010 is a main housing, and the second housing 2040 may include a driving unit (or a rolling actuator, 2021). The first housing 2010 may include the sliding structure 720, and a central axis of the sliding structure may be fixed to the first housing 2010. When the electronic device 101 is switched to an open state or a closed state, the second housing 2040 may linearly move using the driving unit 2021 to cause the display module 160 to slide-in or slide-out. The driving unit 2021 may be disposed inside a space formed by the display module 160, the first housing 2010, and the second housing 2040, and separation of the driving unit 2021 may be prevented by a support member 2020 included in the space. A cover 1030 (e.g., a glass cover) may be disposed on the rear surface 703 of the first housing 2010 and the second housing 2040. The AOA antenna 730 may be oriented to face the front surface 701 when the electronic device 101 is in the open state, and may be oriented to face the rear surface 703 when the electronic device 101 is in the closed state.

In certain embodiments, when the electronic device 101 performs a sliding or rolling operation of the display module 160 using the driving unit (or a rolling actuator, 2021), an actual slide length of the display module 160 may be determined based on the number of rotations of the motor of the driving unit and the rotation time thereof, so that the open state, the closed state, and/or the intermediate state of the electronic device 101 may be identifiable to the processor.

Figure 21:
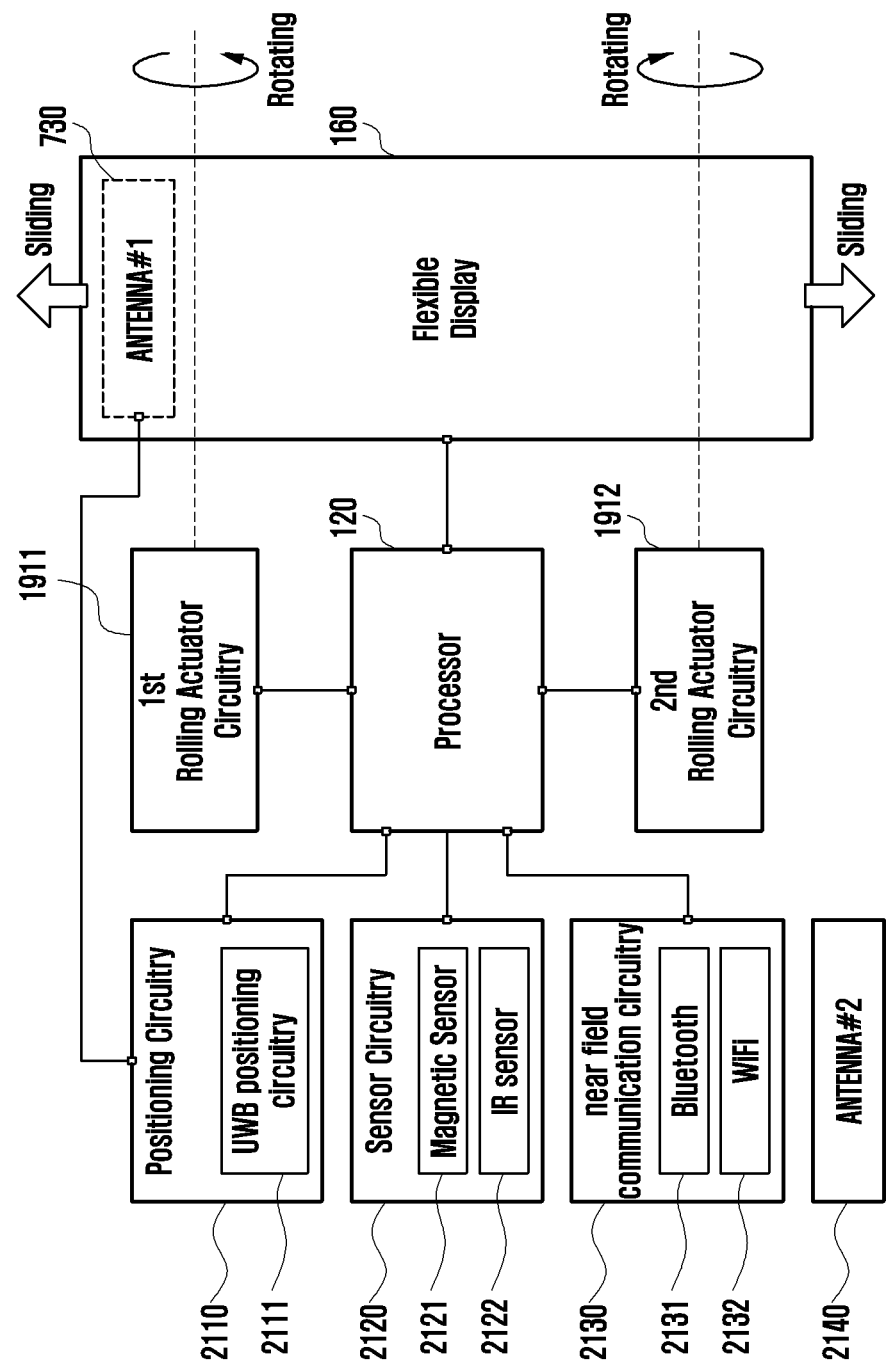
FIG. 21 is a block diagram illustrating an example electronic device according to certain embodiments of the disclosure.

FIG. 21 is a block diagram illustrating the electronic device 101 according to certain embodiments of the disclosure.

The electronic device 101 may include the processor 120, the display module 160, a positioning circuitry 2110, a sensor circuitry 2120, a near field communication circuitry 2130, the first antenna 730, a second antenna 2140, and one or more driving units 1911 and 1912.

The display module 160 may slide-in or slide-out by the rotational motion of the one or more driving units 1911 and 1912 driven under the control of the processor 120. The display module 160 may include the first antenna 730 in the extended area. The first antenna 730 may be the AOA antenna 730.

In certain embodiments, the one or more driving units 1911 and 1912 may not be included in the components of the electronic device 101.

The positioning circuitry 2110 may be a communication circuitry (e.g., the communication module 190). The positioning circuitry 2110 may include an ultra-wide band (UWB) positioning circuitry 2111. The positioning circuitry 2110 may transmit and receive a positioning signal from the first antenna 730 and/or the second antenna 2140, and may transmit received signal information to the processor 120.

The processor 120 may determine the relative distance, direction, and/or altitude between the electronic device 101 and the external electronic device based on the signal information received from the positioning circuitry 2110, and may control to display a sharing interface based on the determined relative distance, direction, and/or altitude between the electronic device 101 and the external electronic device on the display module 160.

The sensor circuitry 2120 may include at least one of a magnetic sensor (or a Hall sensor, 2121) and/or an IR sensor (or an optical sensor, 2122).

The sensor circuitry 2120 may determine whether the display module 160 of the electronic device 101 is in a slit-in or slit-out state based on a change in the magnetic force using the magnetic sensor 2121 and/or a change in the detection pattern using the IR sensor 2122.

The near field communication circuitry 2130 may include at least one of a Bluetooth communication circuitry 2131 and/or a Wi-Fi communication circuitry 2132. The near field communication circuitry 2130 may receive a message regarding communication establishment (e.g., Bluetooth or Wi-Fi) with an external electronic device through the second antenna 2140 and/or the first antenna 730, or may perform communication with the external electronic device communication.

The second antenna 2140 may be an antenna formed on a side surface surrounding a space surrounding the front surface 701 and the rear surface 702 of the electronic device 101. The second antenna 2140 may be an antenna included in the frame of the electronic device 101. The second antenna 2140 is a directional antenna, and may receive a positioning message signal from the external electronic device and may transmit signal information to the processor 120.

In certain embodiments, when the electronic device 101 performs a sliding or rolling operation of the display module 160 using the driving units 1911 and 1912, the sliding length of the display module 160 may be determined based on the number of rotations of the motor of the driving units and the rotation time thereof, thereby determining the open state, the closed state, and/or the intermediate state of the electronic device 101. The electronic device according to certain embodiments disclosed herein may be one of various types of electronic devices. The electronic devices may include, for example, a portable communication device (e.g., a smart phone), a computer device, a portable multimedia device, a portable medical device, a camera, a wearable device, or a home appliance. The electronic device according to embodiments of the disclosure is not limited to those described above.

It should be appreciated that certain embodiments of the disclosure and the terms used therein are not intended to limit the technological features set forth herein to particular embodiments and include various changes, equivalents, or alternatives for a corresponding embodiment. With regard to the description of the drawings, similar reference numerals may be used to designate similar or relevant elements. A singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "a first", "a second", "the first", and "the second" may be used to simply distinguish a corresponding element from another, and does not limit the elements in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled/connected with/to the other element directly (e.g., wiredly), wirelessly, or via a third element.

As used herein, the term "module" may include a unit implemented in hardware, software, or firmware, and may be interchangeably used with other terms, for example, "logic," "logic block," "component," or "circuit". The "module" may be a minimum unit of a single integrated component adapted to perform one or more functions, or a part thereof. For example, according to an embodiment, the "module" may be implemented in the form of an application-specific integrated circuit (ASIC).

Certain embodiments as set forth herein may be implemented as software (e.g., the program 140) including one or more instructions that are stored in a storage medium (e.g., the internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it. This allows the machine to be operated to perform at least one function according to the at least one instruction invoked. The one or more instructions may include a code generated by a complier or a code executable by an interpreter. The machine-readable storage medium may be provided in the form of a non-transitory storage medium. The term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to certain embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to certain embodiments, each element (e.g., a module or a program) of the above-described elements may include a single entity or multiple entities. According to certain embodiments, one or more of the above-described elements may be omitted, or one or more other elements may be added. Alternatively or additionally, a plurality of elements (e.g., modules or programs) may be integrated into a single element. In such a case, according to certain embodiments, the integrated element may still perform one or more functions of each of the plurality of elements in the same or similar manner as they are performed by a corresponding one of the plurality of elements before the integration. According to certain embodiments, operations performed by the module, the program, or another element may be carried out sequentially, in parallel, repeatedly, or heuristically, or one or more of the operations may be executed in a different order or omitted, or one or more other operations may be added.

What is claimed is:

1. An electronic device, comprising:
   a display including a first screen area that is maintained in exposure to an external environment, and an extended screen area that is exposed or stowed, according to a state of the display of the electronic device;
   communication circuitry configured to transmit and receive a signal to or from an antenna disposed within the extended screen area, and wherein a location of the antenna changes in the electronic device changes when the state of the display of the electronic device changes;
   a memory; and
   a processor operatively coupled to the display, the antenna, the communication circuitry, and the memory,
   wherein the memory stores instructions executable by the processor to cause the electronic device to:
   determine a position of the electronic device relative to an external electronic device, using the antenna,
   execute a sharing operation with the external electronic device,
   identify whether the display of the electronic device is disposed in a first state or a second state,
   based on detecting that the display is disposed in the first state, perform a first positioning operation for the external electronic device, and display a user interface including first information based on the first positioning operation on the display.

2. The electronic device of claim 1, wherein the instructions are further executable by the processor to:
based on detecting that the display is disposed in the second state, perform a second positioning operation for the external electronic device, and
display the user interface including second information based on the second positioning operation on the display.

3. The electronic device of claim 1, wherein the instructions are further executable by the processor to:
detect whether the state changes from the first state to the second state,
based on detecting a change from the first state to the second state, perform a second positioning operation for the external electronic device, and
control the display to display the user interface based on the second positioning operation.

4. The electronic device of claim 3, wherein the instructions are further executable by the processor to:
simultaneously display the first information obtained during the first state and second information obtained during the second state for a predetermined time, when the state of changes from the first state to the second state.

5. The electronic device of claim 4, wherein when the predetermined time lapses, the first information is removed from display, while the second information is maintained on display.

6. The electronic device of claim 1, wherein:
the first state includes a closed state of the electronic device, and
the second state includes an open state of the electronic device.

7. The electronic device of claim 6, wherein:
in the open state, the extended screen area is extended from an interior of the electronic device to the external environment, via mechanically sliding out of the electronic device, and
in the closed state, the extended screen area is stowed within the interior of the electronic device, via mechanically sliding into the electronic device.

8. The electronic device of claim 1, wherein the instructions are further executable by the processor to:
display an image and/or an icon for the external electronic device corresponding to directivity of the antenna, and
arrange the display of the image and/or the icon on the user interface to indicate a highest priority of the external electronic device for the sharing operation.

9. The electronic device of claim 1, further comprising:
a near field communication circuitry,
wherein the instructions are further executable by the processor to cause the electronic device to:
determine whether a communication message is received from the external electronic device through the near field communication circuitry,
determine whether the external electronic device is detected through the antenna when the communication message is received, and
change the state of the electronic device when the external electronic device is not detected through the antenna.

10. The electronic device of claim 1, further comprising:
a sensor circuitry,
wherein the processor is configured to detect the state of the electronic device through the sensor circuitry based on at least one of a change in a magnetic force, and a change in a detection pattern.

11. A method in an electronic device, comprising:
executing a sharing operation to transmit and receive data with an external electronic device using an antenna;
detecting whether a display of the electronic device is in a first state or second state according to whether an extendable screen area of the display is stowed within the electronic device, or extended to be exposed to an external environment of the electronic device, and wherein a location of the antenna changes when the display of the electronic device from the first state to the second state;
executing, by a processor, a first positioning operation for the external electronic device based on detecting the display is in the first state; and
displaying a user interface including first information based on the first positioning operation on the display.

12. The method of claim 11, further comprising:
based on detecting that the display is disposed in the second state, executing a second positioning operation for the external electronic device, and
displaying the user interface including second information based on the second positioning operation on the display.

13. The method of claim 11, further comprising:
detecting whether a state changes from the first state to the second state,
based on detecting a change from the first state to the second state, executing a second positioning operation for the external electronic device, and
displaying the user interface based on the second positioning operation.

14. The method of claim 13, further comprising:
simultaneously displaying the first information obtained during the first state and second information obtained during the second state for a predetermined time, when the state of changes from the first state to the second state.

15. The method of claim 14, further comprising:
when detecting elapse of the predetermined time, removing the first information obtained in the first state and displaying the second information obtained in the second state.

16. The method of claim 11, wherein:
the first state includes a closed state of the electronic device, and
the second state includes an open state of the electronic device.

17. The method of claim 16, wherein:
in the open state, the extendable screen area is extended from an interior of the electronic device to the external environment, via mechanically sliding out of the electronic device, and
in the closed state, the extendable screen area is stowed within the interior of the electronic device, via mechanically sliding into the electronic device.

18. The method of claim 11, further comprising:
displaying an image and/or an icon for the external electronic device corresponding to directivity of the antenna, and
arranging the display of the image and/or the icon on the user interface to indicate a highest priority of the external electronic device for the sharing operation.

19. The method of claim 11, further comprising:
determining whether a communication message is received through a near field communication (NFC) circuitry,
determining whether the external electronic device having transmitted the communication message is detected through the antenna when the communication message is received, and
changing a state of the electronic device when the external electronic device having transmitted the communication message is not detected through the antenna.

20. The method of claim 11, wherein s state of the display is detected based on at least one of a change in a magnetic force and a change in a detection pattern as detected through sensor circuitry of the electronic device.

* * * * *